United States Patent
Toyoda et al.

(10) Patent No.: US 7,618,767 B2
(45) Date of Patent: Nov. 17, 2009

(54) ILLUMINANT DISTRIBUTION EVALUATION METHOD, OPTICAL MEMBER MANUFACTURING METHOD, ILLUMINATION OPTICAL DEVICE, EXPOSURE APPARATUS, AND EXPOSURE METHOD

(75) Inventors: Mitsunori Toyoda, Sendai (JP); Naonori Kita, Ageo (JP)

(73) Assignee: Nikon Corporation, Tokyo (JP)

( * ) Notice: Subject to any disclaimer, the term of this patent is extended or adjusted under 35 U.S.C. 154(b) by 577 days.

(21) Appl. No.: 11/352,263

(22) Filed: Feb. 13, 2006

(65) Prior Publication Data

US 2006/0166142 A1    Jul. 27, 2006

Related U.S. Application Data

(63) Continuation-in-part of application No. PCT/JP2004/011131, filed on Aug. 4, 2004.

(30) Foreign Application Priority Data

Aug. 18, 2003  (JP)  ............................ P2003-294096
Oct. 9, 2003   (JP)  ............................ P2003-350400

(51) Int. Cl.
    *H01L 21/00*    (2006.01)
(52) U.S. Cl. ................... 430/311; 351/160; 351/161
(58) Field of Classification Search ................. 430/311; 703/2; 355/30, 53
    See application file for complete search history.

(56) References Cited

U.S. PATENT DOCUMENTS

| 4,598,197 | A | 7/1986 | Morita et al. |
| 5,867,319 | A | 2/1999 | Sugiyama et al. |
| 6,554,427 | B1 * | 4/2003 | Davis et al. ................. 351/177 |
| 2003/0025890 | A1 | 2/2003 | Nishinaga |
| 2004/0036977 | A1 | 2/2004 | Tanaka et al. |

FOREIGN PATENT DOCUMENTS

| JP | A-59-028337  | 2/1984 |
| JP | A-07-142306  | 6/1995 |
| JP | A-08-162397  | 6/1996 |
| JP | A-10-062305  | 3/1998 |
| JP | A-10-189427  | 7/1998 |
| JP | A-2001-318026 | 11/2001 |
| JP | A-2002-098519 | 4/2002 |
| JP | A-2002-100561 | 4/2002 |
| JP | A-2004-056103 | 2/2004 |
| JP | A-2004-266259 | 9/2004 |

* cited by examiner

*Primary Examiner*—Diane I Lee
*Assistant Examiner*—Mesfin T Asfaw
(74) *Attorney, Agent, or Firm*—Oliff & Berridge, PLC

(57) ABSTRACT

There is disclosed an evaluation method for evaluating a one-dimensional illumination distribution using polynomials, the method comprising steps of: setting up, as the polynomials, one-dimensional power polynomials which are orthogonal in a closed interval; and approximating the one-dimensional illumination distribution with the power polynomials to obtain the coefficients of respective terms of the power polynomials.

51 Claims, 9 Drawing Sheets

ILLUMINANT DISTRIBUTION EVALUATION METHOD, OPTICAL MEMBER MANUFACTURING METHOD, ILLUMINATION OPTICAL DEVICE, EXPOSURE APPARATUS, AND EXPOSURE METHOD

CROSS-REFERENCE TO RELATED APPLICATIONS

This is a continuation-in-part application of application serial no. PCT/JP2004/011131 filed on Aug. 4, 2004, now pending, and incorporated by reference in its entirety.

BACKGROUND OF THE INVENTION

1. Field of the Invention

The present invention relates to a method of evaluating illumination distribution, a manufacturing method of an optical member, an illumination optical device, an exposure apparatus, and an exposure method, and particularly to manufacturing of a micro fly's-eye lens used in an illumination optical apparatus of an exposure apparatus for manufacturing micro devices, e.g. semiconductor devices, imaging devices, liquid crystal display devices, thin film magnetic heads or the like, through lithography processing.

2. Related Background Art

In such a typical exposure apparatus, a light beam emitted from a light source enters a fly's-eye lens to form, on its back focal plane, a secondary light source which is composed of numerous light sources. After having been limited by means of an aperture diaphragm disposed in proximity to the back focal plane of the fly's-eye lens, the light beam from the secondary light source enters a condenser lens. The aperture diaphragm limits the shape or size of the secondary light source to a desired shape or size, depending on a desired illumination condition (exposure condition).

The light beam collected by the condenser lens superimposingly illuminates a mask having a predefined pattern formed thereon. The light which transmitted through the mask pattern forms an image on a wafer by means of projection optics. In such a manner, a mask pattern is projection-exposed (transferred) on the wafer. Here, the pattern formed on the mask is highly integrated, whereby it is essential to have a uniform illumination distribution on the wafer in order to precisely transfer this micro-pattern on the wafer.

In an exposure apparatus having the above-mentioned arrangement, it is necessary to provide as many as possible micro lens elements which compose the fly's-eye lens in order to enhance the uniformity of the illumination distribution. It is also necessary to form a secondary light source having a shape similar to the desired shape in order to avoid optical loss at the aperture diaphragm. Accordingly, it is conceivable, for example, to make the size of the micro lens elements composing the fly's-eye lens very small, in other words, to use a micro fly's-eye lens.

Thus, a micro fly's-eye lens is composed by monolithically forming numerous micro refracting surfaces whereas a fly's-eye lens is composed by arranging numerous lens elements in rows and columns and closely packed. That is, whereas the fly's-eye lens is composed by combining numerous lens elements which have been individually polished into a dense array, the micro fly's-eye lens is composed by forming numerous micro refracting surfaces by applying MEMS technique (such as lithography and etching), for example, to a parallel plane glass plate.

Thus, in manufacturing, the fly's-eye lens can be assembled by inspecting the shape of polished refracting surface lens elements, selecting a lens element which satisfy the specification, and using only the lens element having a refracting surface with a high precision. However, in a micro fly's-eye lens, since all of the micro refracting surfaces should be manufactured simultaneously by etching, which is difficult to obtain a surface shape of a higher quality than the polishing, the yield rate becomes considerably lower than that of a fly's-eye lens.

In the micro fly's-eye lens currently under development, shape precision (precision of the surface shape of micro refracting surface) with an order of several tens of nanometer (nm) is required when designing. For example, according to a typical exemplary design, illumination variation (illumination unevenness) of 0.1% occurs due to a 10 nm shape variation (shape error) of the micro refracting surface, in the case where all of the micro refracting surfaces within the micro fly's-eye lens have a shape identical to one another. Therefore, very high processing precision of several tens of nm is required within the effective region of the micro fly's-eye lens in order to achieve the desired specification (spec) to suppress the illumination unevenness on the field of illumination below 0.5%.

However, in a micro fly's-eye lens with all of the micro refracting surfaces being simultaneously manufactured by etching, it is difficult to process all of the micro refracting surfaces with a very high precision of several tens of nm. Thus, as a method to relax the requirement for such high shape precision, it is conceivable to moderately vary and average the shape of micro refracting surfaces within the micro fly's-eye lens. In other words, the requirement for the shape precision of micro refracting surfaces can be significantly relaxed by moderately changing (moderately varying) the shape of micro refracting surfaces within the effective region of the micro fly's-eye lens.

When applying a method which relaxes the requirement for the shape precision by moderately changing the shape of micro refracting surfaces, it is important to control the non-uniformity of the shape of micro refracting surfaces within a given range in order to stably mass-manufacture micro fly's-eye lenses. To control the shape non-uniformity of the micro refracting surfaces, a method which measures the surface shape of each micro refracting surface using a shape measurement apparatus, for example, can be used. However, this method has an inconvenience in that it not only requires troublesome work in predicting the illumination distribution by calculation from shape data of each micro refracting surface, but also is low in precision of the predicted illumination distribution.

On the other hand, it is conceivable to employ a method (hereafter referred to as "HITS") which measures the illumination distribution generated by means of a plurality of partial regions within the effective region of the micro fly's-eye lens, using probe light with beam size substantially smaller than the effective region of the micro fly's-eye lens. When controlling shape non-uniformity of the micro refracting surfaces by HITS method, although the troublesome work of predicting the illumination distribution by calculation from the shape data of each micro refracting surface becomes unnecessary, a need arises to analytically evaluate the illumination unevenness component by expressing, according to a simple function, the illumination distribution data (raw data)

obtained by measuring the illumination distribution generated by means of respective partial regions.

SUMMARY OF THE INVENTION

It is an aspect of the present invention, contrived in view of the above-mentioned problems, to provide an evaluation method which can analytically evaluate the illumination unevenness component by expressing the illumination distribution data according to a simple function.

It is also an aspect of the present invention to provide a manufacturing method which can control non-uniformity of the shape of micro refracting surfaces so that the illumination distribution of a desired precision can be obtained by means of an optical member such as a micro fly's-eye lens, for example.

It is also an aspect of the present invention to provide a high-performance illumination optical apparatus which can illuminate the plane to be illuminated with a desired illumination condition, using, for example, a micro fly's-eye lens which can provide the illumination distribution with a desired precision. It is also an object of the present invention to provide an exposure apparatus and an exposure method which can perform favorable exposure under a favorable illumination condition, using a high-performance illumination optical apparatus for illuminating the plane to be illuminated with a desired illumination condition.

In order to address the above-mentioned problems, the first embodiment of the present invention provides an evaluation method for evaluating a one-dimensional illumination distribution using polynomials, the method comprising steps of:

setting up, as the polynomials, one-dimensional power polynomials which are orthogonal in a closed interval; and approximating the one-dimensional illumination distribution with the power polynomials to obtain the coefficients of respective terms of the power polynomials.

The second embodiment of the present invention provides a manufacturing method of an optical member, the method comprising steps of:

measuring the two-dimensional illumination distribution generated by means of the optical member;

converting the two-dimensional illumination distribution obtained in the measurement step into a one-dimensional illumination distribution along a predefined direction;

setting up, as the polynomials for use in evaluation of the one-dimensional illumination distribution, one-dimensional power polynomials which are orthogonal in a closed interval;

approximating the one-dimensional illumination distribution with the power polynomials to obtain the coefficients of respective terms of the power polynomial; and manufacturing the optical member, using an information relating to the coefficients of respective terms obtained in the approximation step as a control indicator.

The third embodiment of the present invention provides a manufacturing method of an optical member having a plurality of optical elements disposed two-dimensionally and being composed so that a light beam via respective optical elements super-imposingly form a two-dimensional illumination distribution, the method comprising steps of:

measuring the plurality of two-dimensional illumination distributions respectively generated by means of a plurality of partial regions within the effective region formed by the plurality of optical elements;

converting the plurality of two-dimensional illumination distributions obtained in the measurement step into a plurality of one-dimensional illumination distributions along a predefined direction;

setting up, as the polynomials for evaluating the plurality of one-dimensional illumination distributions, one-dimensional power polynomials which are orthogonal in a closed interval;

approximating each of the plurality of one-dimensional illumination distributions by the power polynomials to obtain a plurality of groups of coefficients of respective terms of the power polynomials; and controlling the non-uniformity of the shape of respective optical elements in the optical member, using an information relating to the plurality of groups of coefficients obtained in the approximation step as a control indicator. In this case, the optical member is preferably a micro fly's-eye lens.

The fourth embodiment of the present invention provides an illumination optical apparatus for illuminating the plane to be illuminated, wherein the illumination distribution is generated on the plane to be illuminated or on a location optically approximately conjugate with the plane to be illuminated, by means of the optical member manufactured using the manufacturing method of the second or the third embodiment.

The fifth embodiment of the present invention provides an exposure apparatus having the illumination optical apparatus of the fourth embodiment and exposing the mask pattern disposed on the plane to be illuminated onto a photosensitive substrate.

The sixth embodiment of the present invention provides an exposure method comprising illuminating the mask disposed on the plane to be illuminated, using the illumination optical apparatus of the fourth embodiment and exposing the mask pattern onto a photosensitive substrate.

The seventh embodiment of the present invention provides an illumination measurement apparatus comprising a photodetector for measuring the illumination distribution and a processing unit for evaluating the illumination distribution with polynomials based on a signal from the photodetector, and outputting the same, wherein the processing unit approximates a one-dimensional illumination distribution corresponding to the illumination distribution, by one-dimensional power polynomials which are orthogonal in a closed interval to obtain the coefficients of respective terms of the power polynomials.

The eighth embodiment of the present invention provides an exposure apparatus for exposing a mask pattern onto a photosensitive substrate, the exposure apparatus comprising:

the illumination measurement apparatus of the seventh embodiment for evaluating, by polynomials, and outputting the illumination distribution on the photosensitive substrate or on a surface which is optically approximately conjugate with the photosensitive substrate; and an adjustment means for adjusting the illumination distribution based on the output of the illumination measurement apparatus.

The ninth embodiment of the present invention provides an exposure method for exposing a mask pattern onto a photosensitive substrate, the method comprising steps of:

evaluating an illumination distribution on the photosensitive substrate or on a surface which is optically approximately conjugate with the photosensitive substrate, using the illumination measurement apparatus of the seventh embodiment; and adjusting the illumination distribution based on the evaluation of the evaluation step.

The tenth embodiment of the present invention provides a method for measuring the illumination distribution using an imaging device, the method comprising steps of:

acquiring an offset for correcting the influence on the actual measurement result of the illumination distribution caused by the sensitivity non-uniformity on the imaging plane of the imaging device; and correcting the actual measurement result of the illumination distribution, based on the offset.

The eleventh embodiment of the present invention provides an illumination measurement apparatus for measuring the illumination distribution according to the illumination measurement method of the tenth embodiment, the apparatus comprising:

an imaging device for measuring the illumination distribution; and a processing unit for correcting, based on the offset, the actual measurement result of the illumination distribution obtained by the imaging device.

The twelfth embodiment of the present invention provides a manufacturing method of an optical member, the method comprising steps of:

generating a predefined illumination distribution by means of the optical member; and measuring the illumination distribution, using the illumination measurement method of the tenth embodiment.

The thirteenth embodiment of the present invention provides an optical member manufactured using the manufacturing method of the second, third, or twelfth embodiment.

The fourteenth embodiment of the present invention provides a optical member having a plurality of optical elements disposed two-dimensionally and generating a two-dimensional illumination distribution by a light beam via respective optical elements, wherein a plurality of two-dimensional illumination distributions respectively generated by means of a plurality of partial regions within the effective region formed by the plurality of optical elements are converted into a plurality of one-dimensional illumination distributions along a predefined direction, and each of the one-dimensional illumination distributions is approximated by one-dimensional power polynomials which are orthogonal in a closed interval to obtain a plurality of groups of coefficients of respective terms of the power polynomials, and RSS≦1% is satisfied where RSS denotes the root sum square of the standard deviation of the plurality of groups of coefficient.

The fifteenth embodiment of the present invention provides an illumination optical apparatus for illuminating the plane to be illuminated, wherein the illumination distribution is generated on the plane to be illuminated or on a location optically approximately conjugate with the plane to be illuminated, by means of the optical member of the thirteenth or the fourteenth embodiment.

The sixteenth embodiment of the present invention provides an exposure apparatus having the illumination optical apparatus of the fifteenth embodiment for exposing a mask pattern disposed on the plane to be illuminated onto a photosensitive substrate.

The seventeenth embodiment of the present invention provides an exposure method, wherein a mask disposed on the plane to be illuminated is illuminated using the illumination optical apparatus of the fifteenth embodiment, and the mask pattern is exposed onto a photosensitive substrate.

The present invention will be more fully understood from the detailed description given hereinbelow and the accompanying drawings, which are given by way of illustration only and are not to be considered as limiting the embodiment.

Further scope of applicability of the embodiment will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Embodiments of the present invention will be described, referring to the accompanying drawings.

Figure 1:
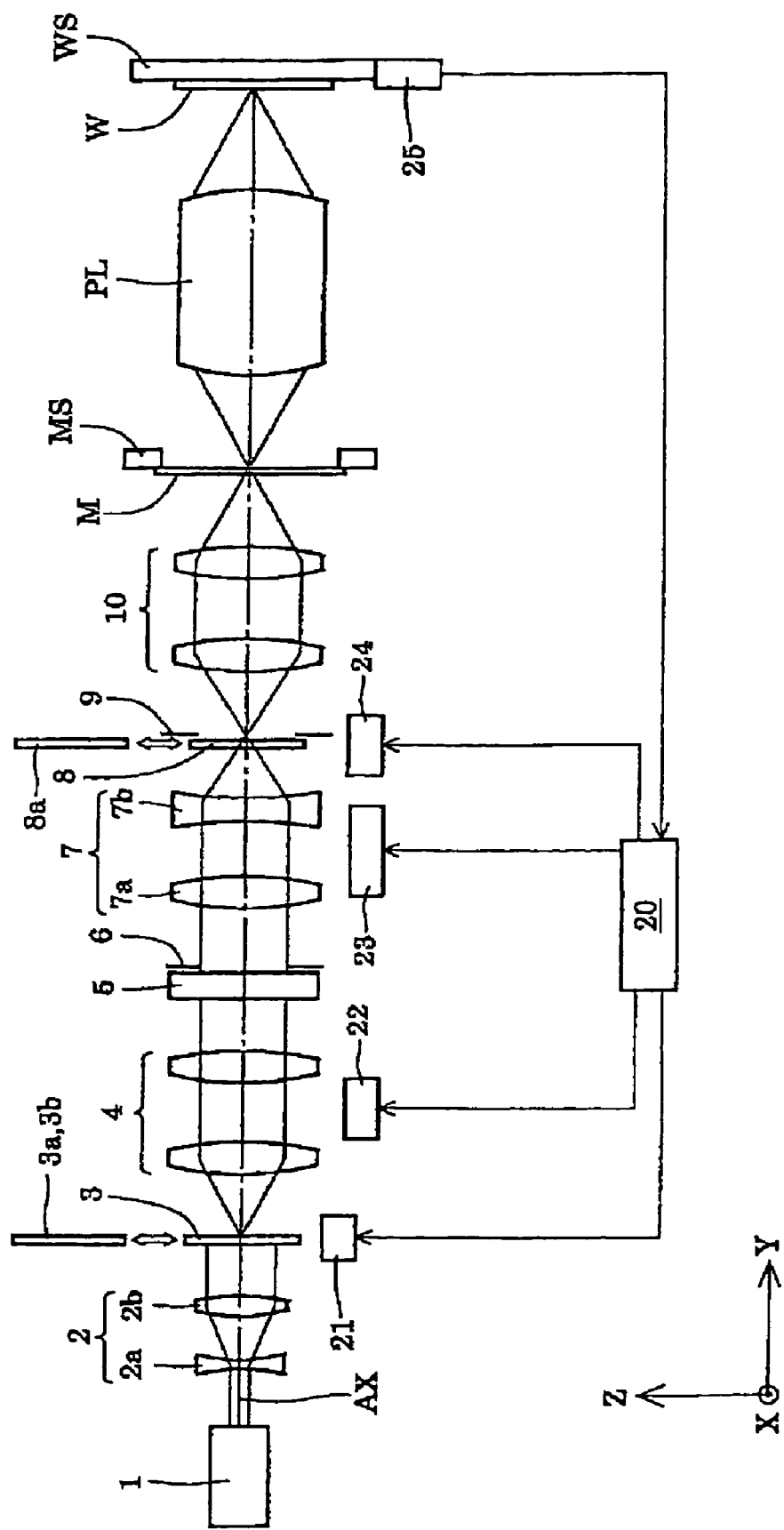
FIG. 1 is a schematic view illustrating an arrangement of an exposure apparatus comprising an illumination optical apparatus according to an embodiment of the present invention.

FIG. 1 is a schematic view illustrating an arrangement of an exposure apparatus comprising an illumination optical apparatus according to an embodiment of the present invention. In FIG. 1, the Y-axis is taken along the normal direction of a wafer W which is a photosensitive substrate, and X- and Z-axes are respectively taken along two directions orthogonal to each other within a surface which is parallel to the wafer W. Note that, in FIG. 1, the illumination optical apparatus is arranged to perform a normal circular illumination.

The exposure apparatus of the present embodiment comprises a laser source 1 for providing exposure light (illuminating light). As the laser source 1, a KrF excimer laser source supplying light with 248 nm wavelength, or an ArF excimer laser source supplying light with 193 nm wavelength may be used, for example. The approximately parallel light beam emitted from the laser source 1, having an elongated rectangular cross section extending along the X-axis direction, enters a beam expander 2 composed of a pair of lenses 2a and 2b. Each of the lenses 2a and 2b has a negative and positive refracting power, respectively, in the plane of FIG. 1 (in Y-Z plane). Thus, the light beam which entered the beam expander 2 is expanded in the plane of FIG. 1 and shaped into a light beam having a predefined rectangular cross section.

The approximately parallel light beam through the beam expander 2 provided as a shaping optics enters a zoom lens 4 via a diffractive optical element 3 provided for circular illumination. In proximity to the back focal plane of the zoom lens 4, the incidence plane of a micro fly's-eye lens 5 is positioned. Generally, a diffractive optical element is composed by forming a corrugation on the substrate with a pitch of approximately the wavelength of the exposure light (illumination light), and has a function of diffracting the incident beam towards a desired angle. Specifically, the diffractive optical element 3 converts the rectangular parallel light beam, which entered along the optical axis AX, into a divergent light beam having a circular cross section.

The diffractive optical element 3 is disposed to be freely insertible or detachable across the illumination light path, and switchable with a diffractive optical element 3a for annular illumination or a diffractive optical element 3b for quadrupolar illumination. Here, switching from the diffractive optical element 3 for circular illumination to the diffractive optical element 3a for annular illumination or the diffractive optical element 3b for quadrupolar illumination is performed by a drive system 21 operating based on instructions from a control unit 20. In addition, change of the focal length of the zoom lens 4 is performed by a drive system 22 operating based on instructions from the control unit 20.

The micro fly's-eye lens 5 is an optical member composed of numerous micro lenses (optical elements) disposed in rows and columns and closely packed. Generally, a micro fly's-eye lens is composed by simultaneously forming numerous micro refracting surfaces by applying, for example, MEMS technique (lithography and etching) to parallel plane glass plates. Thus, the light beam through the diffractive optical element 3 forms, by means of the zoom lens 4, a circular field of illumination with the center on the optical axis AX, for example, on the incidence plane of the micro fly's-eye lens 5 acting as a wavefront splitting optical integrator.

Here, the size (i.e. the diameter) of the circular field of illumination varies, depending on the focal length of the zoom lens 4. The light beam which entered the micro fly's-eye lens 5 is split two-dimensionally by numerous micro lenses whereby forming light sources on the back focal planes of respective micro lenses in which light beam was incident. In this manner, a circular, substantially surface light source (hereafter referred to as "secondary light source") having a light intensity distribution approximately equal to that of the circular field of illumination formed by the light beam incident into the micro fly's-eye lens 5 is formed on the back focal plane of the micro fly's-eye lens 5.

The light beam from the circular secondary light source formed on the back focal plane of the micro fly's-eye lens 5 enters an aperture diaphragm 6 disposed nearby. The aperture diaphragm 6, disposed on the illumination pupil plane in relation of an optical Fourier transform with the mask M (and wafer W), has a function of defining the shape or size of the secondary light source. After having been subjected to light collection by condenser optics 7 including a positive and a negative lens components 7a and 7b, the light from the secondary light source through the aperture diaphragm 6 having a circular aperture (light transmission part) superimposingly illuminates, by means of a correction filter 9, a mask blind 9 disposed on a surface which is optically conjugate with the mask M (and wafer W).

Here, the positive lens component 7a is arranged to be movable along optical axis AX. In addition, the negative lens component 7b is arranged to be tiltable against the optical axis AX around the X-axis and the Z-axis. Displacement of the positive lens component 7a and tilting of the negative lens component 7b are performed by the drive system 23 operating based on instructions from the control unit 20. On the other hand, the correction filter 8 disposed in proximity to the mask blind 9 is selected among a plurality of correction filters 8a having mutually different transmittance distributions, and positioned in the illumination light path. Switching between the plurality of correction filters 8a in the illumination light path is performed by the drive system 24 operating based on instructions from the control unit 20. The operation of the positive lens component 7a, the negative lens component 7b, and the correction filter 8 will be described below.

Thus, a rectangular field of illumination, having a shape similar to the shape of each micro lens composing the micro fly's-eye lens 5, is formed in the mask blind 9. After having been subjected to light collection by imaging optics 10, the light beam through a rectangular aperture (light transmission part) of the mask blind 9 superimposingly illuminates the mask M having a predefined pattern formed thereon. In this manner, the imaging optics 10 forms an image of the rectangular aperture of the mask blind 9 on the mask M which is supported by a mask stage MS. In other words, the mask blind 9 composes a field stop for defining an illumination region to be formed on the mask M (and wafer W).

On the mask M a pattern to be transferred is formed and, of the entire patterned region, a rectangular pattern region having the long side along the X-axis direction and the short side along the Z-axis direction, respectively, will be illuminated, for example. The light beam having transmitted through the mask pattern M forms, by means of projection optics PL, an image of the mask pattern on the wafer W which is a photosensitive substrate. In other words, on the wafer W supported by the wafer stage WS, a pattern image is formed on a rectangular effective exposure region (i.e., static exposure region) having the long side along the X-axis direction and the short side along the Z-axis direction, for example, so that it optically corresponds to a rectangular illumination region on the mask M.

As described above, the illumination region on the mask M and the effective exposure region on the wafer W disposed by projection optics PL are rectangular having their the short sides along the Z-axis direction. Therefore, by synchronously displacing (scanning) the mask stage MS and the wafer stage WS, i.e., the mask M and the wafer W along the short side of the rectangular effective exposure region and the illumination region, i.e., along the Z-axis direction, the mask pattern will be scanned and exposed on the wafer W, across a shot region having a width equal to the long side of the effective exposure region and a length according to the amount of scanning (amount of displacement) of the wafer W.

The exposure apparatus of the present embodiment has an illumination measurement apparatus 25 installed thereon for measuring the illumination distribution on the imaging plane (surface of the wafer W) of the projection optics PL. The illumination measurement apparatus 25 has a function of measuring the illumination distribution and evaluating the measured illumination distribution with polynomials and outputting the result. The illumination distribution information on the imaging plane of the projection optics PL measured by the illumination measurement apparatus 25 is supplied to the control unit 20. The arrangement and operation of the illumination measurement apparatus 25 will be described below.

In addition, an annular illumination can be performed by providing, in the illumination light path, a diffractive optical element 3a in place of the diffractive optical element 3. The diffractive optical element 3a for annular illumination converts the rectangular parallel light beam, which entered along the optical axis AX, into a divergent light beam having an annular cross section. Therefore, the light beam through the diffractive optical element 3a forms an annular field of illumination with the center on the optical axis AX, for example, on the incidence plane of the micro fly's-eye lens 5. As a result, an annular secondary light source having a light intensity distribution approximately equal to that of the annular field of illumination formed on the incident surface is also formed on the back focal plane of the micro fly's-eye lens 5.

In addition, a quadrupolar illumination can be performed by providing a diffractive optical element 3b in place of the diffractive optical element 3 in the illumination light path. The diffractive optical element 3b for quadrupolar illumination converts the rectangular parallel light beam, which entered along the optical axis AX, into a divergent light beam having a quadrupolar cross section. Thus, the light beam through the diffractive optical element 3b forms a quadrupolar field of illumination with the center on the optical axis AX, for example, on the incidence plane of micro fly's-eye lens 5. As a result, a quadrupolar secondary light source having a light intensity distribution approximately equal to that of the quadrupolar field of illumination formed on the incident surface is also formed on the back focal plane of the micro fly's-eye lens 5.

Figure 2:
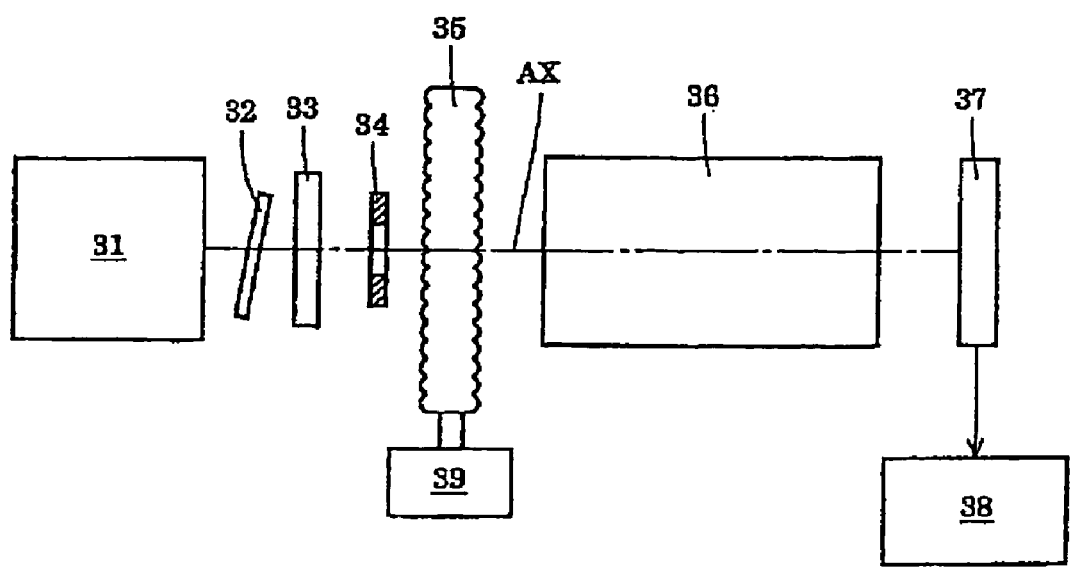
FIG. 2 is a schematic view illustrating the measurement of the illumination distribution generated by means of partial regions of a micro fly's-eye lens by HITS when manufacturing the micro fly's-eye lens.

Prior to describing the characteristic operation of the exposure apparatus according to the present embodiment, the manufacturing method of the micro fly's-eye lens according to the present embodiment will be described below. FIG. 2 is a schematic view illustrating the measurement of the illumination distribution generated by means of partial regions of a micro fly's-eye lens by HITS when manufacturing the micro fly's-eye lens. Referring to FIG. 2, the light emitted from the laser source 31 of the same type as the laser source 1 of the exposure apparatus enters the micro fly's-eye lens 35 which is the object of measurement, via the ND filter 32, the diffusing plate 33, and the diaphragm member 34.

Here, the ND filter 32 has a function of adjusting the amount of transmitted light depending on the response level of the imaging device 37 described below. The diffusing plate 33 has a function of converting the parallel light incident from the laser source 31 into a divergent light so that the condition of the incident light to the micro fly's-eye lens 35 is approximately matches the actual specification of the exposure apparatus. The diaphragm member 34 has an aperture (light transmission part) the size of which is substantially smaller than the effective region of the micro fly's-eye lens 35. Specifically, if the effective region of the micro fly's-eye lens 35 includes 10,000 to 20,000 optical elements, for example, the diaphragm member 34 has an aperture with a size corresponding to, for example, several tens of optical elements.

In this manner, the probe light which passed through the aperture of the diaphragm member 34 forms, by means of the partial regions corresponding to the several tens of optical elements of the micro fly's-eye lens 35 and a relay lens system 36, an illumination distribution on the imaging plane of an imaging device 37 such as, for example, a CCD. Here, the relay lens system 36 is arranged so that the front focal plane of the relay lens system 36 approximately corresponds with the exit plane of the micro fly's-eye lens 35, and the back focal plane of the relay lens system 36 approximately corresponds with the imaging plane of the imaging device 37. In other words, the position of the imaging device 37 on the imaging plane corresponds to the position of the mask blind 9 in the exposure apparatus of FIG. 1. The illumination distribution data measured by the imaging device 37 is provided to the processing unit 38. In addition, the micro fly's-eye lens 35 is arranged to be supported by a stage 39 and to move two-dimensionally over a surface which is orthogonal to the optical axis AX.

If all of the micro refracting surfaces in the effective region of the micro fly's-eye lens 35 have been manufactured just as designed, the illumination distribution generated by the imaging plane of the imaging device 37 by means of any of the partial regions within the effective region is approximately uniform, and the so-called illumination unevenness will not occur substantially. However, for the micro fly's-eye lens 35 in which all of the micro refracting surfaces are manufactured simultaneously by etching processing, it is difficult to process all of the micro refracting surfaces with the desired shape precision. Thus, with the manufacturing method of the micro fly's-eye lens according to the present embodiment, shape non-uniformity of the micro refracting surfaces is controlled so that an approximately uniform illumination distribution can be obtained by means of the micro fly's-eye lens.

Figure 3:
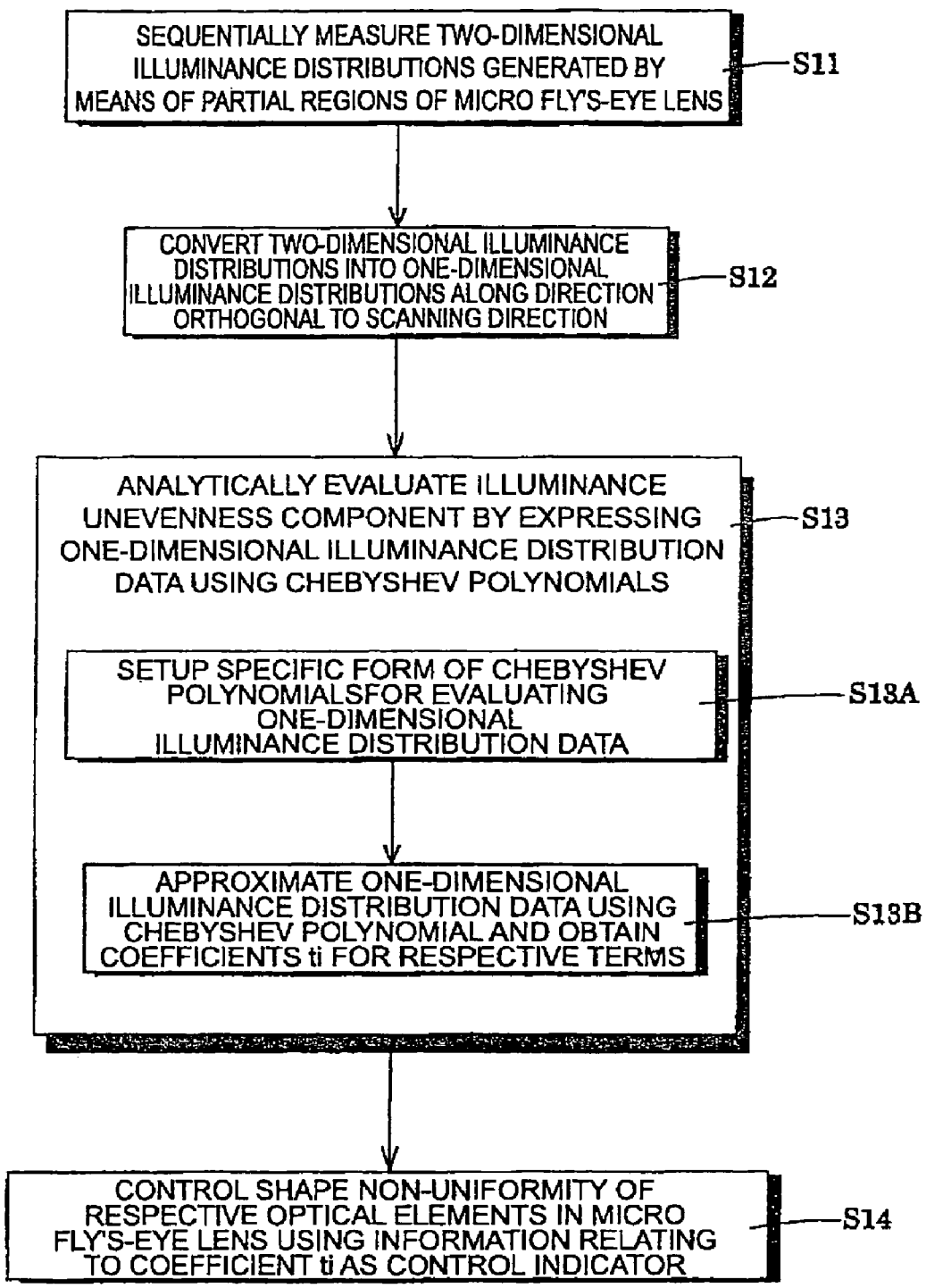
FIG. 3 is a flow chart schematically illustrating respective steps of the manufacturing method of a micro fly's-eye lens according to the present embodiment

FIG. 3 is a flow chart schematically illustrating respective steps of the manufacturing method of a micro fly's-eye lens according to the present embodiment. Referring to FIG. 3, the manufacturing method of the present embodiment, according to the so-called HITS, displaces the stage 39 two-dimensionally over a surface which is orthogonal to the optical axis AX and sequentially measures the two-dimensional illumination distributions respectively generated on the imaging planes of the imaging device 37 by means of a plurality (e.g., several hundreds) of partial regions within the effective region of the micro fly's-eye lens 35 (S11). The exposure apparatus of the present embodiment performs, as previously described, projection exposure by displacing the mask M and the wafer W in synchronization along the Z-axis direction which is the scanning direction.

Therefore, in the plurality of two-dimensional illumination distributions obtained in the measurement step S11, the illumination unevenness along the scanning direction (the Z-axis direction in FIG. 1) is not very important since it is averaged (accumulated) by scan exposure, but the illumination unevenness along a direction (the X-axis direction in FIG. 1) which is orthogonal to the scan direction is important. In the present embodiment, therefore, the plurality of two-dimensional illumination distributions obtained in the measurement step S11 are accumulated along the scanning direction, and respectively converted into a plurality of one-dimensional illumination distributions along a direction which is orthogonal to the scanning direction (S12), in the processing unit 38 to which the illumination distribution data measured by the imaging device 37 is sequentially provided.

The plurality of one-dimensional illumination distribution data (raw data) thus obtained in the conversion step S12 is difficult, due to its low readability, to be used as a control indicator for manufacturing the micro fly's-eye lens. Therefore, in the present embodiment, the processing unit 38 analytically evaluates (S13) the illumination unevenness component by expressing the plurality of one-dimensional illumination distribution data obtained in the conversion step S12 using the Chebyshev polynomials as a one-dimensional power polynomials which are orthogonal in a closed interval. Prior to describing the internal process of the evaluation step S13, a brief description of the Chebyshev polynomials will be given in the following.

The Chebyshev polynomials are polynomials which are orthogonal in a closed interval (−1, +1), that is, a closed interval $-1 \leq x \leq 1$, with respective terms Ti (x) defined by the following expressions (1) to (3). Thus, using the zero-th order term $T_0$ (x), the first-order term $T_1$ (x), and the recurrence formula (3), the second-order term $T_2$ (x), the third-order term $T_3$ (x), and the fourth-order term $T_4$ (x), for example are expressed by the following equations (4) to (6).

$$T_0(x)=1 \tag{1}$$

$$T_1(x)=x \tag{2}$$

$$T_{n+1}(x)-2xT_n(x)+T_{n-1}(x)=0 \tag{3}$$

$$T_2(x)=2x^2-1 \quad (4)$$

$$T_3(x)=4x^3-3x \quad (5)$$

$$T_4(x)=8x^4-8x^2+1 \quad (6)$$

In the present embodiment, the one-dimensional illumination distribution I (x) is expressed by equation (7) below, where the distance of the farthest position from the optical axis AX among the positions within the illumination region which is superimposingly formed on the imaging plane of the imaging device 37 by means of respective optical elements of the micro fly's-eye lens 35 (optical elements corresponding to each micro refracting surfaces) is normalized to 1. Here, in equation (7), Σ denotes summation of i=0 to n, and $t_i$ is the coefficient of the i-th order term $T_i(x)$.

$$I(x)=\Sigma t_i T_i(x)=t_0 T_0(x)+t_1 T_1(x)+t_2 T_2(x)+t_3 T_3(x)+t_4 T_4(x) \quad (7)$$

Figure 4:
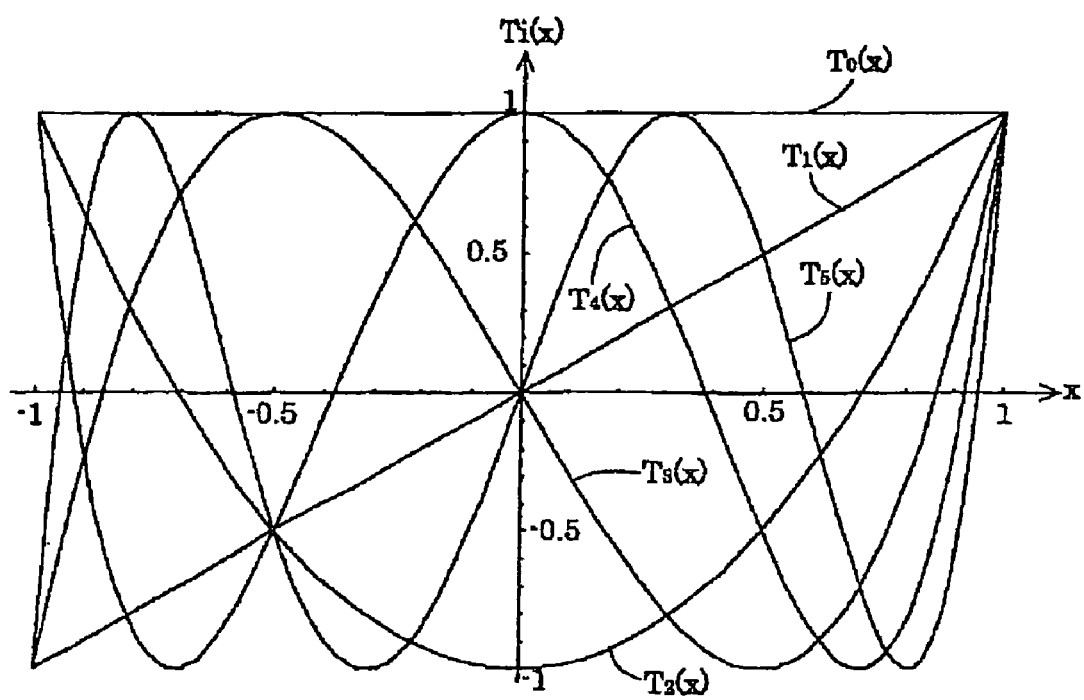
FIG. 4 illustrates the change of values of the zero-th order term to the fifth-order terms, i.e. $T_0(x) \sim T_5(x)$, of the Chebyshev polynomials (Tchebycheff polynoials) in a closed interval $-1 \leqq x \leqq +1$, respectively.

FIG. 4 is a diagram illustrating the value change of the zero-th order terms to the fifth-order terms $T_0(x)$ to $T_5(x)$ of the Chebyshev polynomials in the closed interval $-1 \leq x \leq +1$, respectively. In FIG. 4, the ordinate shows the values of respective terms $T_i(x)$ and the abscissa shows the position variable x (normalized distance), respectively. Referring to FIG. 4, it can be seen that the first-order term $T_1(x)$ of the Chebyshev polynomials corresponds to the inclination unevenness component (first-order unevenness component) of the illumination distribution, the second-order term $T_2(x)$ corresponds to the convexoconcave unevenness component (secondary unevenness component) of the illumination distribution, third-order term $T_3(x)$ corresponds to the third-order unevenness component of the illumination distribution, and the fourth-order term $T_4(x)$ corresponds to the fourth-order unevenness component (M type unevenness component or W type unevenness component) of the illumination distribution.

Referring again to FIG. 4, it can be seen that the contrast of every term $T_i(x)$ except the zero-th order term $T_0(x)$ is 1 in the Chebyshev polynomials. Here, the contrast of respective terms is a quantity defined by (maximum−minimum)/(absolute maximum+absolute minimum), using the maximum and minimum in the closed interval $-1 \leq x \leq +1$ as with the concept of contrast in the illumination distribution. Since the maximum in the closed interval $-1 \leq x \leq +1$ is always +1 and the minimum is always −1 for every term $T_i(x)$ except the zero-th order term $T_0(x)$, the contrast is always equal to 1. Here, since the zero-th order term $T_0(x)$ is a constant term, the values of the zero-th order term $T_0(x)$ and its coefficient $t_0$ relate to the illumination level, but they have nothing to do with the illumination unevenness.

As stated above, the Chebyshev polynomial is a simple function with a form of a power polynomial. In addition, each of the first-order term $T_1(x)$, the second-order term $T_2(x)$, the third order term $T_3(x)$, the fourth-order term $T_4(x)$ and the like of the Chebyshev polynomials independently expresses typical illumination unevenness component, providing superior affinity with the measured illumination unevenness shape. As a result, they can express a complicated illumination distribution with higher precision by fewer terms (a fewer number of orders used) than Fourier series or Fourier expansion widely used in prior art. In addition, since the contrast of every term $T_i(x)$ except the zero-th order term $T_0(x)$ is 1, i.e., the same with one another, in the Chebyshev polynomials, the value of the coefficient $t_i$ of respective terms $T_i(x)$ directly expresses the degree of each illumination unevenness component.

Since it is necessary to control the (maximum of) contrast of the illumination distribution on the mask M (and the illumination distribution on the wafer W), for the illumination optical apparatus (1 to 10) installed on the exposure apparatus, relation between the contrast of the illumination distribution and the coefficients of respective terms of the Chebyshev polynomials will be easier to understand if the illumination distribution is expressed using the Chebyshev polynomials. Now, the Legendre polynomials or the Hermite polynomials are widely known as orthogonal function systems defined in the closed interval (−1, 1) as the Chebyshev polynomials. However, these polynomials, with the contrast of respective terms not being constant, are not suitable for application to illumination systems which need to control the contrast of the illumination distribution.

Thus, the processing unit 38, in the evaluation step S13 of the present embodiment, sets (S13A) a specific form (such as number of orders used) of the Chebyshev polynomials, as the polynomials for evaluating the plurality of one-dimensional illumination distribution data obtained in the conversion step S12. Subsequently, the processing unit 38 approximates the plurality of one-dimensional illumination distribution data obtained in the conversion step S12 respectively, using the Chebyshev polynomials set in the setup step S13A, and obtains (S13B) a plurality of groups of coefficients $t_i$ for respective terms of the Chebyshev polynomials. Here, when fitting (approximating) using the Chebyshev polynomials, coefficients $t_i$ of respective terms can be obtained, using the least square method, for example.

Finally, shape non-uniformity of respective optical elements in the micro fly's-eye lens is controlled (S14), using, as the control indicator, the information relating to a plurality of groups of coefficient $t_i$ for respective terms of the Chebyshev polynomials output from the processing unit 38, i.e., the plurality of groups of coefficients $t_i$ obtained in the approximation step S13B. In the control step S14, for example, statistics such as the mean value or the standard deviation of the coefficients of respective terms may be obtained and used as the control indicator. Alternatively, a value which can be obtained by combining the above-mentioned statistics (RSS (Root sum square) of the standard deviation of the coefficients of respective terms) may also be used as the control indicator.

Here, a description will be given for a case in which RSS (Root sum square) of the standard deviation of the coefficients of respective terms of the Chebyshev polynomials, for example, is used as the control indicator, in the control step S14 of the present embodiment. Firstly, variation of the coefficients for respective terms of the Chebyshev polynomials is calculated over the surface. In other words, the standard deviation value $\sigma_i$ is calculated for each of the coefficients of respective terms of the Chebyshev polynomials, with each of the coefficients corresponding to each of the plurality of partial regions within the effective region of the micro fly's-eye lens 35. Here, RSS (Root sum square) is calculated as shown in the following equation (8) for the third to the tenth order coefficients among the coefficients of respective terms of the Chebyshev polynomials.

[equation 1]

$$RSS = \sqrt{\sum_{i=3}^{10} \sigma_i^2} \quad (8)$$

In the above-mentioned equation (8), the third to the tenth order coefficients among the coefficients of respective terms of the Chebyshev polynomials are chosen as stated above.

The first and the second order coefficients are not chosen, in the present embodiment, as a control indicator of shape non-uniformity of the micro refracting surfaces, because they correspond, respectively, to the inclination unevenness component (first-order unevenness component) of the illumination distribution and the convexoconcave unevenness component (secondary unevenness component) of the illumination distribution, and because these components can be corrected by the illumination optical apparatus (or the exposure apparatus) having the micro fly's-eye lens 35 installed thereon.

Now, in the present embodiment, it is preferable to keep the RSS value of the micro fly's-eye lens 35 equal to or lower than 1%. With a RSS value of the micro fly's-eye lens 35 being equal to or lower than 1%, the difference of illumination unevenness between the illumination conditions in the illumination optical apparatus (or the exposure apparatus) having the micro fly's-eye lens 35 installed thereon can be reduced. It is further preferable to keep the above-mentioned RSS value equal to or lower than 0.65%, in order to have a very small difference of illumination unevenness between the illumination conditions in the illumination optical apparatus (or the exposure apparatus) having the micro fly's-eye lens 35 installed thereon. It is still more preferable to keep the above-mentioned RSS value equal to or lower than 0.5%, in order to have a much smaller difference of illumination unevenness between the illumination conditions in the illumination optical apparatus (or the exposure apparatus) having the micro fly's-eye lens 35 installed thereon.

Here, the RSS value expressed by the equation (8) is at the same level as with the contrast of respective terms of the Chebyshev polynomials. This indicates that the difference of illumination unevenness due to the micro fly's-eye lens 35 for each illumination condition may vary to an extent of the RSS value. In addition, since respective terms $T_i(x)$ of the Chebyshev polynomials in the above-mentioned equations (1) to (6) are not strictly orthogonal to one another, it is preferable to consider normalization coefficients for each of the functions of respective orders, when calculating the RSS value based on the above-mentioned equation (8). However, since the normalization coefficients from the third to the tenth order have a value of approximately 1, the present embodiment performs approximate calculation, giving higher priority to simplicity of calculation.

As stated above, with the manufacturing method of the micro fly's-eye lens according to the present embodiment, the illumination distribution data corresponding to respective partial regions of the micro fly's-eye lens 35 is expressed according to simple functions such as the Chebyshev polynomials with relatively small number of orders, and the illumination unevenness component can be analytically evaluated based on the information relating to the coefficients of respective terms of the Chebyshev polynomials, in the evaluation step S13. As a result, shape non-uniformity of the micro refracting surfaces can be controlled based on the result of the analytical evaluation of the illumination unevenness component, so that the illumination distribution of desired precision is obtained by means of the micro fly's-eye lens Specifically, although it is difficult to process all of the micro refracting surfaces of the micro fly's-eye lens with a high shape precision, it is possible to moderately vary and average the shape of the micro refracting surfaces of the micro fly's-eye lens, using the information relating to a plurality of groups of coefficients $t_i$ obtained in the approximation step S13B as a control indicator. In other words, it is possible to moderately change (moderately vary) the shape of the micro refracting surfaces in the effective region of the micro fly's-eye lens. As a result, the requirement for shape precision of the micro refracting surface can be significantly relaxed, whereby facilitating stable mass manufacturing of micro fly's-eye lenses having a desired optical performance.

In this manner, the illumination optical apparatus (1 to 10) of the present embodiment can illuminate the mask M (and the wafer W) which is a plane to be illuminated in a desired illumination condition, using the micro fly's-eye lens 5 by which the illumination distribution with desired precision can be obtained. As a result, the exposure apparatus of the present embodiment can perform a favorable exposure under a favorable illumination condition, using a high-performance illumination optical apparatus for illuminating the mask M (and wafer W) which is the plane to be illuminated, with a desired illumination condition.

Figure 5:
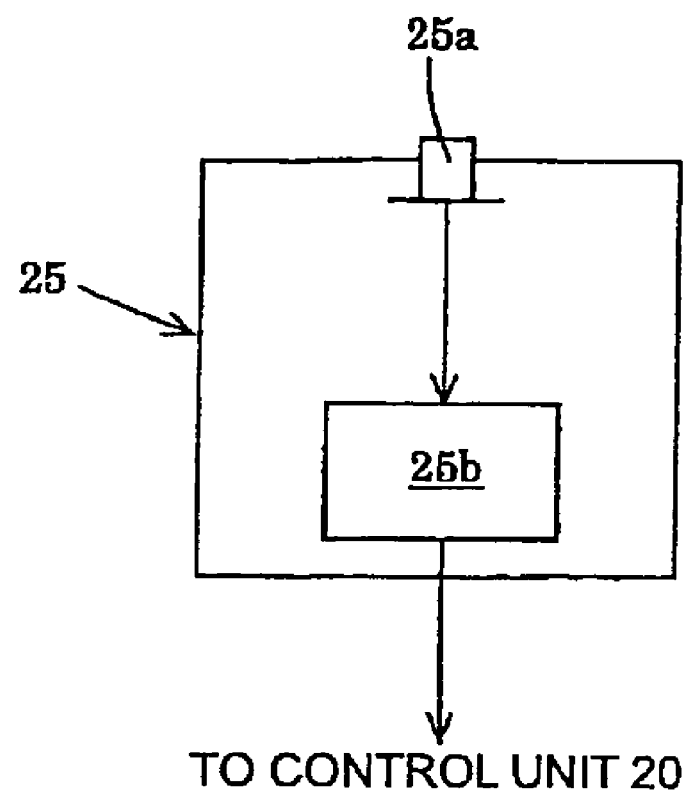
FIG. 5 is a schematic view illustrating the internal structure of an illumination measurement apparatus installed on the exposure apparatus of FIG. 1.

Next, a characteristic operation of the exposure apparatus according to the present embodiment will be described. As stated above, the exposure apparatus of the present embodiment has an illumination measurement apparatus 25 installed for measuring the illumination distribution on the imaging plane (surface of the wafer W) of the projection optics PL. FIG. 5 schematically illustrates the internal arrangement of the illumination measurement apparatus equipped on the exposure apparatus of FIG. 1. Referring to FIG. 5, the illumination measurement apparatus 25 comprises a photodiode 25a, for example, as a photodetector for measuring the illumination distribution on the imaging plane of the projection optics PL. The output of the photodiode 25a is connected to a processing unit 25b, and the output of the processing unit 25b is connected to the control unit 20.

The illumination measurement apparatus 25 sequentially measures the illumination distribution data on the imaging plane of the projection optics PL by means of the photodiode 25a, by displacing the wafer stage WS two-dimensionally over a surface orthogonal to the optical axis AX of the projection optics PL. Here, an arrangement may be employed wherein a plurality of photodiodes 25a are disposed two-dimensionally to perform an batch measurement of the illumination distribution data on the imaging plane of the projection optics PL, without displacing the wafer stage WS. Alternatively, an arrangement may be employed wherein a plurality of photodiodes 25a are disposed linearly to perform a scan measurement of the illumination distribution data on the imaging plane of the projection optics PL, by displacing the wafer stage WS one-dimensionally.

The processing unit 25b has a function similar to that of processing unit 38 shown in FIG. 2. In other words the processing unit 25b accumulates the two-dimensional illumination distribution obtained by means of the photodiode 25a along the scanning direction, and converts the distribution into a one-dimensional illumination distribution along a direction which is orthogonal to the scanning direction. Subsequently, the illumination unevenness component is evaluated analytically, by expressing the converted one-dimensional illumination distribution data using the Chebyshev polynomials. Specifically, the processing unit 25b approximates the one-dimensional illumination distribution data using the Chebyshev polynomials, calculates and outputs the coefficients $t_i$ of respective terms of the Chebyshev polynomials.

The exposure apparatus of the present embodiment comprises, in addition to the illumination measurement apparatus 25, an illumination distribution adjustment mechanism for adjusting the illumination distribution on the imaging plane of the projection optics PL, i.e., a plurality of correction means for correcting respective illumination unevenness components on the imaging plane of the projection optics PL.

Specifically, the inclination unevenness component (first-order unevenness component) of the illumination distribution can be corrected by tilting the negative lens component 7b within the condenser optics 7 relative to the optical axis AX by means of the drive system 23. In addition, the convexoconcave unevenness component (second-order unevenness component) of the illumination distribution can be corrected by displacing the positive lens component 7a of the condenser optics 7 along the optical axis AX by means of the drive system 23. Furthermore, the fourth- or higher-order unevenness component of the illumination distribution can be corrected by positioning, within the illumination light path, the correction filter 8 having a desired transmittance distribution by means of the drive system 24.

The exposure apparatus of the present embodiment provides the analytical evaluation result of the illumination unevenness component included in the illumination distribution on the imaging plane of the projection optics PL, from the illumination measurement apparatus 25 to the control unit 20. The control unit 20 drives, according to the analytical evaluation result of the illumination unevenness component provided from the illumination measurement apparatus 25, the negative lens component 7b of the condenser optics 7, the positive lens component 7a of the condenser optics 7, and the correction filter 8, respectively, as the illumination distribution adjustment mechanism and adjusts the illumination distribution on the imaging plane of projection optics PL.

For details about the correction method of the inclination unevenness component (first-order unevenness component) of the illumination distribution by tilting the negative lens component 7b of the condenser optics 7 relative to the optical axis AX, and the correction method of the convexoconcave unevenness component (secondary unevenness component) of the illumination distribution by displacing the positive lens component 7a of the condenser optics 7 along the optical axis AX, reference can be made to Japanese Patent Application Laid-Open No. Hei 10-189427 and corresponding U.S. Pat. No. 5,867,319. In addition, for details of the correction method of the unevenness component of the fourth- or higher-order the illumination distribution by positioning, in proximity to the mask blind 9, the correction filter 8 having a desired transmittance distribution, reference can also be made to the methods proposed in Japanese Patent Application No. 2003-31954 and Japanese Patent Application No. 2004-2554.

In the above-mentioned embodiment, a positive lens component 7a of the condenser optics 7 is used as a correction means for correcting the convexoconcave unevenness component (secondary unevenness component) of the illumination distribution. Without being limited to this, however, the convexoconcave unevenness component (secondary unevenness component) of the illumination distribution on the imaging plane of projection optics PL can be corrected by rotating a density filter (a filter having a predefined transmittance distribution) positioned in proximity to the mask blind 9 around the optical axis, as disclosed in Japanese Patent Application Laid-Open No. 2002-100561 and corresponding US Patent Application No. US 2003/0025890A.

Alternatively, the convex/concave unevenness component (secondary unevenness component) of the illumination distribution on the imaging plane of projection optics PL can be corrected by rendering, out of the four sides defining a rectangular opening of the mask blind 9, two sides facing each other so as to cross the scanning direction into a predefined curve, as disclosed in Japanese Patent Application Laid-Open No. Sho 59-28337 and corresponding U.S. Pat. No. 4,598,197. Furthermore, illumination unevenness having a complicated form on the imaging plane of the projection optics PL can also be corrected by providing, in proximity to the incidence plane of the micro fly's-eye lens 5, a correction filter having a predefined transmittance distribution defined for every respective optical elements of the micro fly's-eye lens 5.

In addition, although the above-mentioned embodiment assumes that the micro fly's-eye lens has numerous micro refracting surfaces formed in rows and columns on at least either one of the incidence plane and the exit plane, but without being limited to this, the present invention can also be applied to a cylindrical micro fly's-eye lens proposed in Japanese Patent Application Laid-Open No. 2004-56103 and corresponding US Patent Application US 2004/0036977A, in other words, a micro fly's-eye lens having a group of cylindrical lenses formed thereon along directions mutually orthogonal to the incidence plane and the exit plane. Here, US Patent Application US 2004/0036977A is incorporated by reference.

In addition, although the above-mentioned embodiment uses the Chebyshev polynomials for evaluating a one-dimensional illumination distribution, without being limited to this, one-dimensional power polynomials generally orthogonal in a closed interval may be used. In this case, it is preferred that each of the terms of the power polynomials correspond to the illumination unevenness component and that the contrasts of respective terms be approximately equal to one another, as previously described.

Now, when an imaging device 37 such as a CCD is used for measuring the illumination distribution generated by means of partial regions of the micro fly's-eye lens 35 according to HITS in FIG. 2, measurement error may be included in the illumination distribution obtained by means of CCD 37, depending on the sensitivity non-uniformity of respective photodiodes disposed two-dimensionally on the imaging plane of the CCD 37. In the following, an illumination measurement method of the present embodiment will be described, which can measure two-dimensional illumination distribution with high precision by correcting the influences of the sensitivity non-uniformity on the imaging plane of the imaging device such as the CCD in HITS mode shown in FIG. 2, for example, on the actual measurement result of the illumination distribution.

Figure 6:
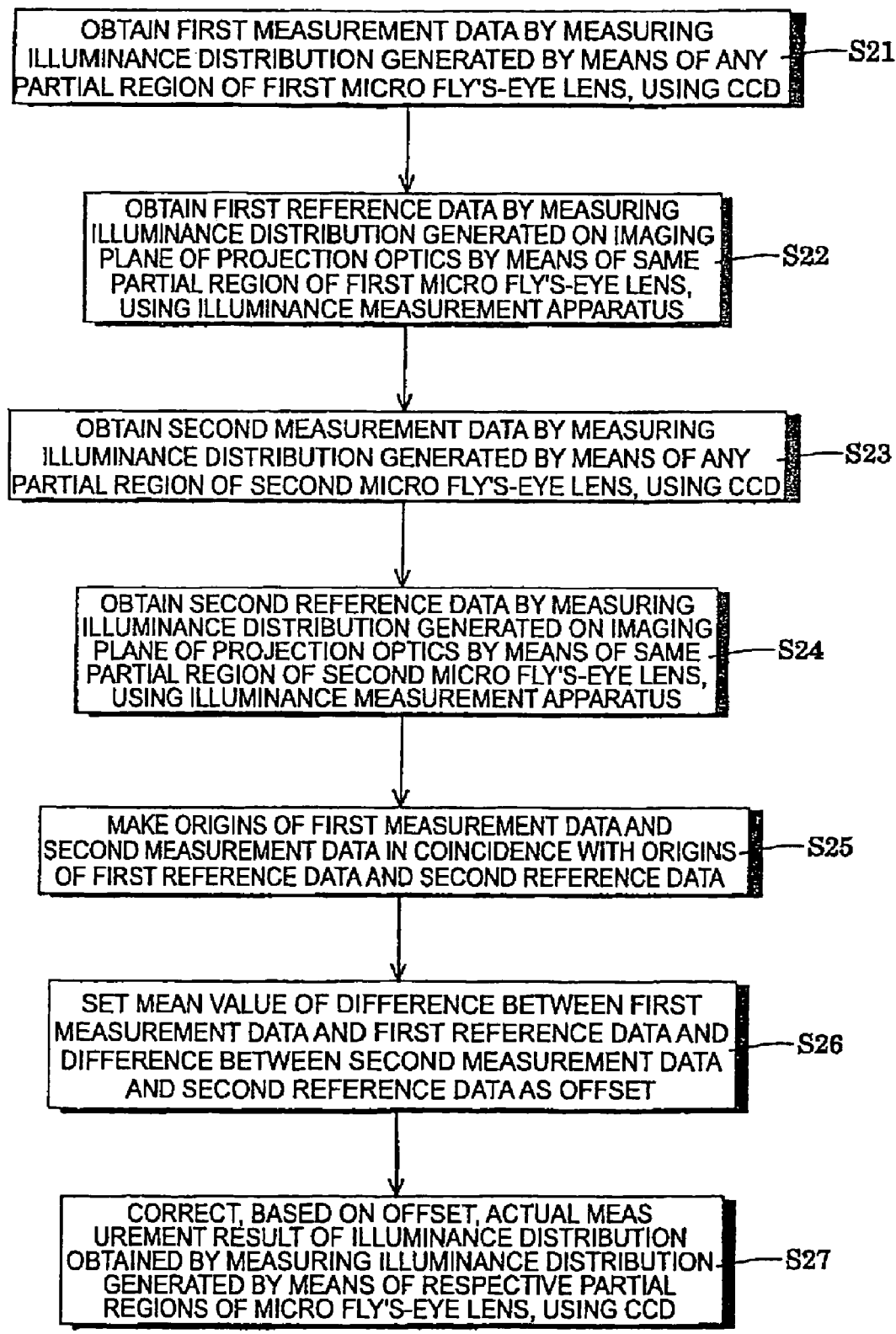
FIG. 6 is a flow chart schematically illustrating respective steps of the illumination measurement method according to the present embodiment.

FIG. 6 is a flow chart schematically illustrating respective steps of the illumination measurement method according to the present embodiment. Referring to FIG. 6, the illumination measurement procedure of the present embodiment, according to HITS mode shown in FIG. 2, obtains a first measurement data A1 (S21) by measuring the illumination distribution generated by means of any partial region of a first micro fly's-eye lens 35a (not shown), using the CCD 37. In addition, a first reference data A2 is obtained (S22) by measuring the illumination distribution generated on the imaging plane of the projection optics PL by means of the same partial region of the first micro fly's-eye lens 35a, using the illumination measurement apparatus 25.

Here, the illumination measurement apparatus 25 sequentially measures the illumination distribution data on the imaging plane of the projection optics PL by means of a single photodiode 25a, by displacing the wafer stage WS two-dimensionally over a surface orthogonal to the optical axis AX of the projection optics PL, as described above. Therefore, the illumination measurement apparatus 25 is different from the CCD 37 which is composed of numerous two-dimensionally disposed photodiodes, in that it is a measurement means which will receive substantially no effect of the sensitivity non-uniformity on the imaging plane. As a result, the first reference data A2 which is the illumination distribution data measured using the illumination measurement apparatus 25 includes no effect of the sensitivity non-uniformity on the imaging plane.

Subsequently, a second measurement data B1 is obtained (S23) by replacing the first micro fly's-eye lens 35a by a second micro fly's-eye lens 35b (not shown), and measuring, according to HITS shown in FIG. 2, the illumination distribution generated by means of any partial region of the second micro fly's-eye lens 35b, using the CCD 37. In addition, a second reference data B2 is obtained (S24) by measuring the illumination distribution generated on the imaging plane of the projection optics PL by means of the same partial region of the second micro fly's-eye lens 35b, using the illumination measurement apparatus 25.

As described above, the first measurement data A1 and the second measurement data B1 are illumination distribution data measured using the same CCD 37, both being similarly subject to the influence of the sensitivity non-uniformity on the imaging plane of CCD 37. Therefore no effect of the sensitivity non-uniformity on the imaging plane of the CCD 37 remains in the difference between the first measurement data A1 and the second measurement data B1 (A1−B1). On the other hand, the first reference data A2 and the second reference data B2 are illumination distribution data respectively measured using the illumination measurement apparatus 25, which is a measurement means receiving substantially no effect of the sensitivity non-uniformity on the imaging plane. Naturally, therefore, the difference between the first reference data A2 and the second reference data B2 (A2−B2) will not be influenced by the sensitivity non-uniformity on the imaging plane.

Thus, if the origins of measurement of the CCD 37 and the illumination measurement apparatus 25 are identical, (which means not only matching of the positions of the origins, but also agreement in concept including the scaling factor of the measurement area), in other words, if the origins of the first measurement data A1 and the second measurement data B1 are in coincidence with the origins of the first reference data A2 and the second reference data B2, the difference between the first measurement data A1 and the second measurement data B1 (A1−B1) should be substantially equal to the difference between the first reference data A2 and the second reference data B2 (A2−B2). Therefore, the present embodiment makes (S25) the origins of the first measurement data A1 and the second measurement data B1 in coincidence with the origins of the first reference data A2 and the second reference data B2, so that the difference between the first measurement data A1 and the second measurement data B1 (A1−B1) will be substantially equal to the difference between the first reference data A2 and the second reference data B2 (A2−B2).

Then, the mean value X (=(X1+X2)/2) of the difference X1 (=A1−A2) between the first measurement data A1 and the first reference data A2, and the difference X2 (=B1−B2) between the second measurement data B1 and the second reference data B2 is set as an offset (S26), under a condition that the origins of the first measurement data A1 and the second measurement data B1, and the origins of the first reference data A2 and the second reference data B2 have been made in coincidence. Finally, according to HITS shown in FIG. 2, the illumination distribution generated by means of respective partial regions of the micro fly's-eye lens 35 is measured sequentially using the CCD 37, followed by correction, based on the offset X, of the actual result of measurement of the illumination distribution (S27).

In this manner, the illumination measurement method of the present embodiment can measure, by HITS shown in FIG. 2, for example, the two-dimensional illumination distribution with high precision, by correcting the actual measurement result of the illumination distribution obtained using the CCD 37 as an imaging device based on a predefined offset X to correct the influence on the actual measurement result of the illumination distribution caused by the sensitivity non-uniformity of the imaging plane of the CCD 37.

Here, the above description sets, as the offset, the mean value X (=(X1+X2)/2) of the difference X1 (=A1−A2) between the first measurement data A1 and the first reference data A2, and the difference X2 (=B1−B2) between the second measurement data B1 and the second reference data B2. Without being limited to this, however, the difference X1 between first measurement data A1 and the first reference data A2, or the difference X2 between the second measurement data B1 and the second reference data B2 may be set as the offset.

Additionally, according to the above description, the second measurement data B1 and the second reference data B2 are used, as well as the first measurement data A1 and the first reference data A2, in order to make the origins of the first measurement data A1 and the second measurement data B1 in coincidence with the origins of the first reference data A2 of and the second reference data B2. However, it may be possible to approximately make the origin of measurement of the CCD 37 in coincidence with the origin of measurement of the illumination measurement apparatus 25 by some method, without using the second measurement data B1 and the second reference data B2, and set, as the offset, the difference X1 (=A1−A2) between the first measurement data A1 and the first reference data A2 obtained in such a condition.

Additionally, according to the above description, an illumination measurement apparatus 25 which measures the illumination distribution data on the imaging plane of projection optics PL by means of a single photodiode 25a by displacing the wafer stage WS two-dimensionally over a surface orthogonal to the optical axis AX of the projection optics PL is used as the measurement means which will not be substantially influenced by the sensitivity non-uniformity on the imaging plane. However, without being limited to this, other suitable measurement means which will not be substantially influenced by the sensitivity non-uniformity on the imaging plane may be used.

Now, in the present embodiment, it is conceivable that value of the offset X changes along modification of the illumination condition (modification of the shape or size of the secondary light source disposed on the illumination pupil plane) due to, for example, angular characteristics (characteristics such that the sensitivity varies according to the incidence angle of the light) in the photodiode 25a of the illumination measurement apparatus 25, or transmittance characteristics (characteristics such that the transmittance distribution of the lens body and the coat vary according to the incidence angle of the light). Thus, in the present embodiment, it is preferable to calculate the value of the offset X for every illumination condition. In this case, the illumination region of a predefined shape corresponding to respective illumination conditions may be split into a plurality of partial regions in the micro fly's-eye lens, and the summation of the plurality of data obtained sequentially for respective partial regions may be used as the measurement data or the reference data.

Figure 7:
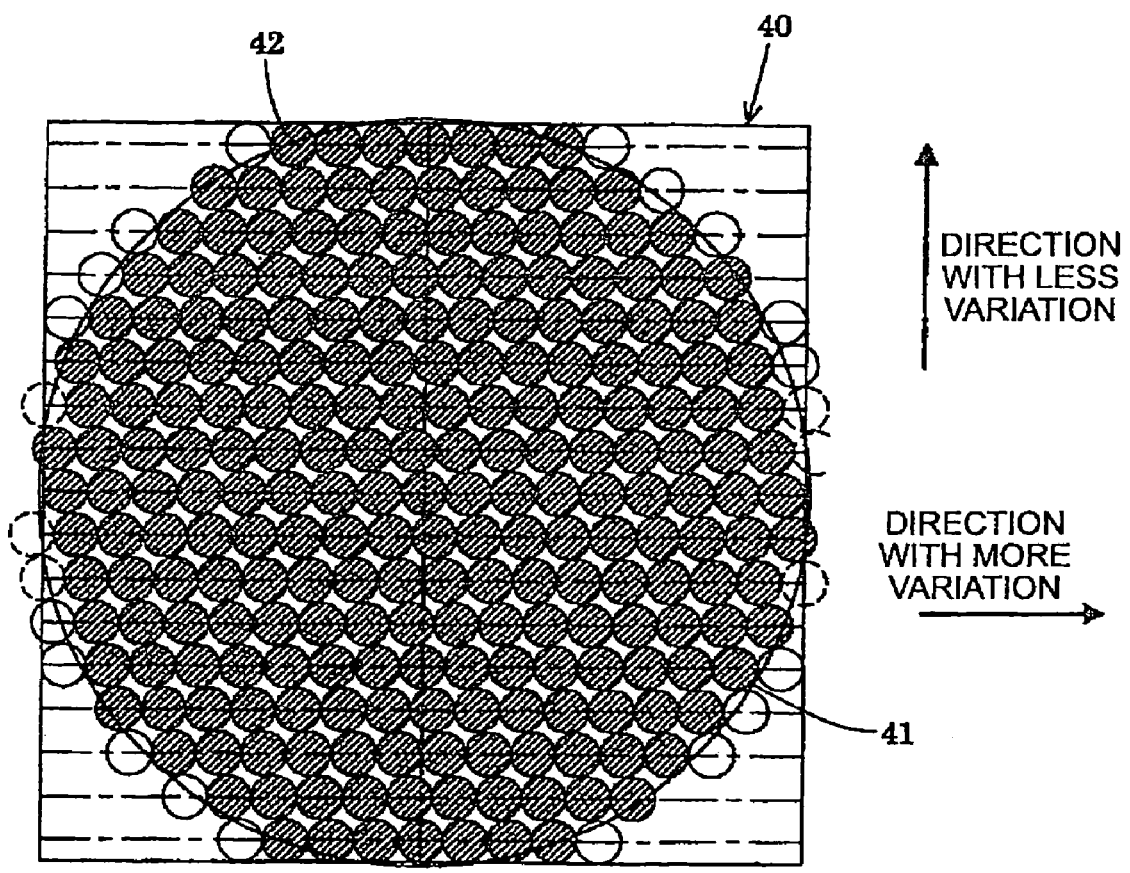
FIG. 7 illustrates an exemplary relationship between a micro fly's-eye lens based on HITS and its partial regions.

In a micro fly's-eye lens formed using MEMS technique, ease of control for controlling the shape non-uniformity in the numerous micro refracting surfaces may be anisotropic due to its manufacturing step. Considering, for example, a micro fly's-eye lens (proposed in Japanese Patent Application Laid-Open No. 2004-56103 and corresponding US Patent Application US 2004/0036977A) having micro refracting surfaces composed of cylindrical lens surfaces disposed in a predefined pitch direction, control of the shape along a direction (the predefined pitch direction mentioned above) orthogonal to the direction of the bus line tends to be easier than the direction of the bus line of the cylinder lens surface (the direction which is orthogonal to the predefined pitch direction mentioned above). Measurement of the illumination distribution of such a micro fly's-eye lens using HITS will be described, referring to FIG. 7. FIG. 7 is planner view showing the relationship between the incidence or exit plane of the micro fly's-eye lens 40 having micro refracting surfaces composed of cylindrical lens surfaces disposed in a predefined pitch direction and the partial region of the probe light used in HITS.

When measuring the illumination distribution generated by means of a plurality of partial regions 42 within the effective region 41 of the micro fly's-eye lens 40, by displacing the micro fly's-eye lens 40 and the probe light two-dimensionally relative to each other, according to HITS, the measurement can be performed in a shorter time with higher precision, by increasing the number of partitions of the plurality of partial regions 42 along the direction having more significant shape non-uniformity compared with the direction having less significant shape non-uniformity. In addition, as for the arrangement of the plurality of partial regions being the measurement region of the probe light, further enhanced precision can be achieved by displacing (displacing) the measurement position of the direction with more significant shape non-uniformity relative to the direction with less significant shape non-uniformity as shown in FIG. 7, rather than disposing them grid-wise.

Additionally, according to the above description, the present invention is applied to an illumination measurement method for measuring a two-dimensional illumination distribution with high precision by correcting the influence on the actual measurement result of the illumination distribution caused by the sensitivity non-uniformity on the imaging plane of the imaging device such as a CCD, in HITS shown in FIG. 2. However, without being limited to this, the present invention can also be applied to a general illumination measurement method for measuring the illumination distribution using an imaging devices having a certain degree of sensitivity non-uniformity on the imaging plane.

The exposure apparatus according to the above-mentioned embodiment can manufacture micro devices (such as semiconductor devices, imaging devices, liquid crystal display devices, thin film magnetic heads) by illuminating the mask (reticle) using the illumination optical apparatus (illumination step) and exposing the transfer pattern formed on the mask onto a photosensitive substrate using the projection optics. An exemplary procedure of manufacturing a semiconductor device as a micro device by forming a predefined circuit pattern on the wafers which is a photosensitive substrate using the exposure apparatus of the above-mentioned embodiment will be described in the following, referring to the flow chart of FIG. 8.

Figure 8:
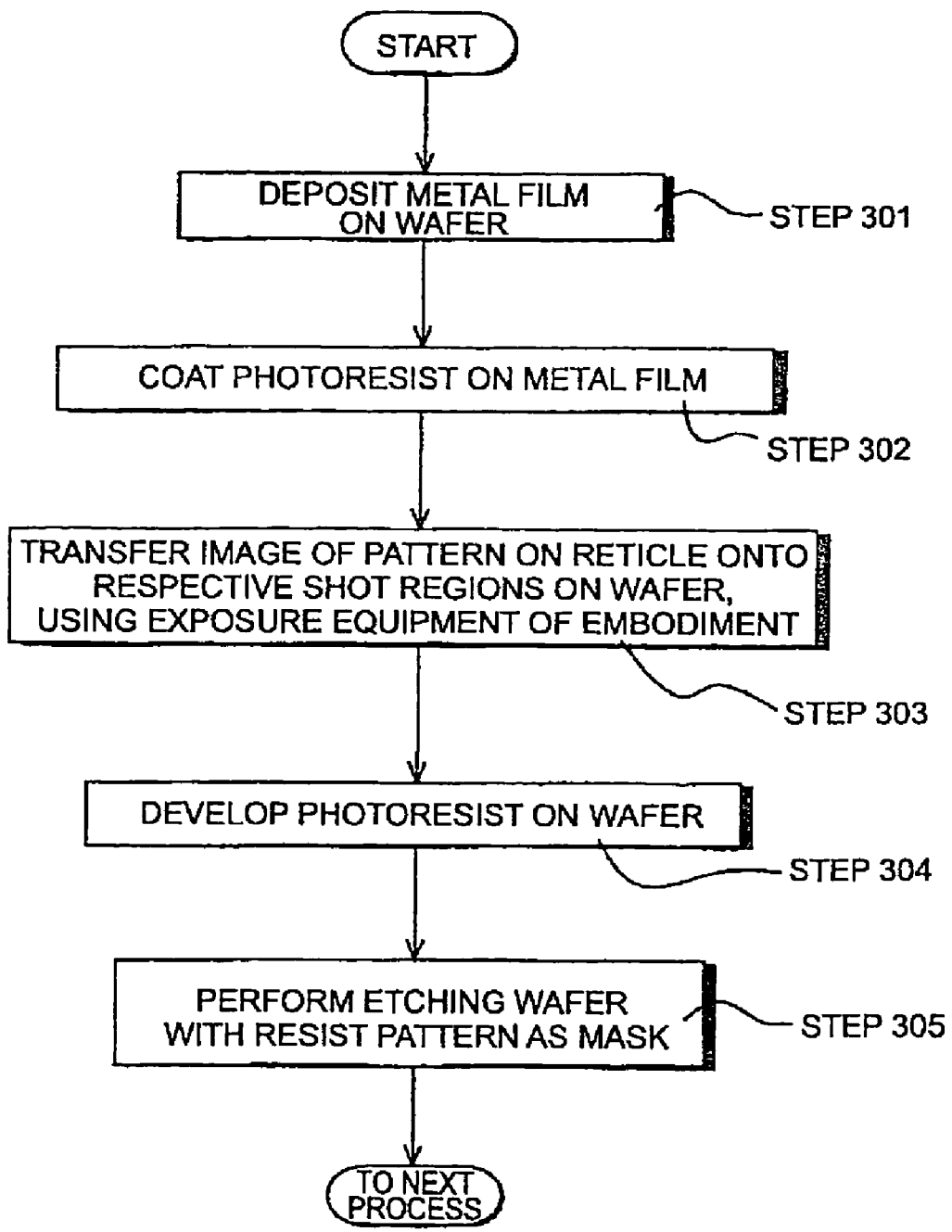
FIG. 8 is a flow chart of the procedure when manufacturing a semiconductor device as a micro device.

First, in step 301 of FIG. 8, metal film is deposited on a wafer of a single lot. Next, in step 302, photoresist is coated on the metal film on the wafer of the single lot. Subsequently, in step 303, an image of the pattern on the mask is transferred by exposure sequentially on respective shot regions on the wafer of the single lot by means of the projection optics, using the exposure apparatus of the embodiment. Then, after the photoresist on the wafer of the single lot is developed in step 304, a circuit pattern corresponding to the pattern on the mask is formed, in step 305, on respective shot regions on respective wafers by performing etching on the wafer of the single lot with a resist pattern as the mask. Subsequently, a device such a semiconductor device is manufactured by forming a circuit pattern on a higher layer. According to the above-mentioned semiconductor device manufacturing method, a semiconductor device having an extremely fine circuit pattern can be manufactured with a favorable throughput.

Figure 9:
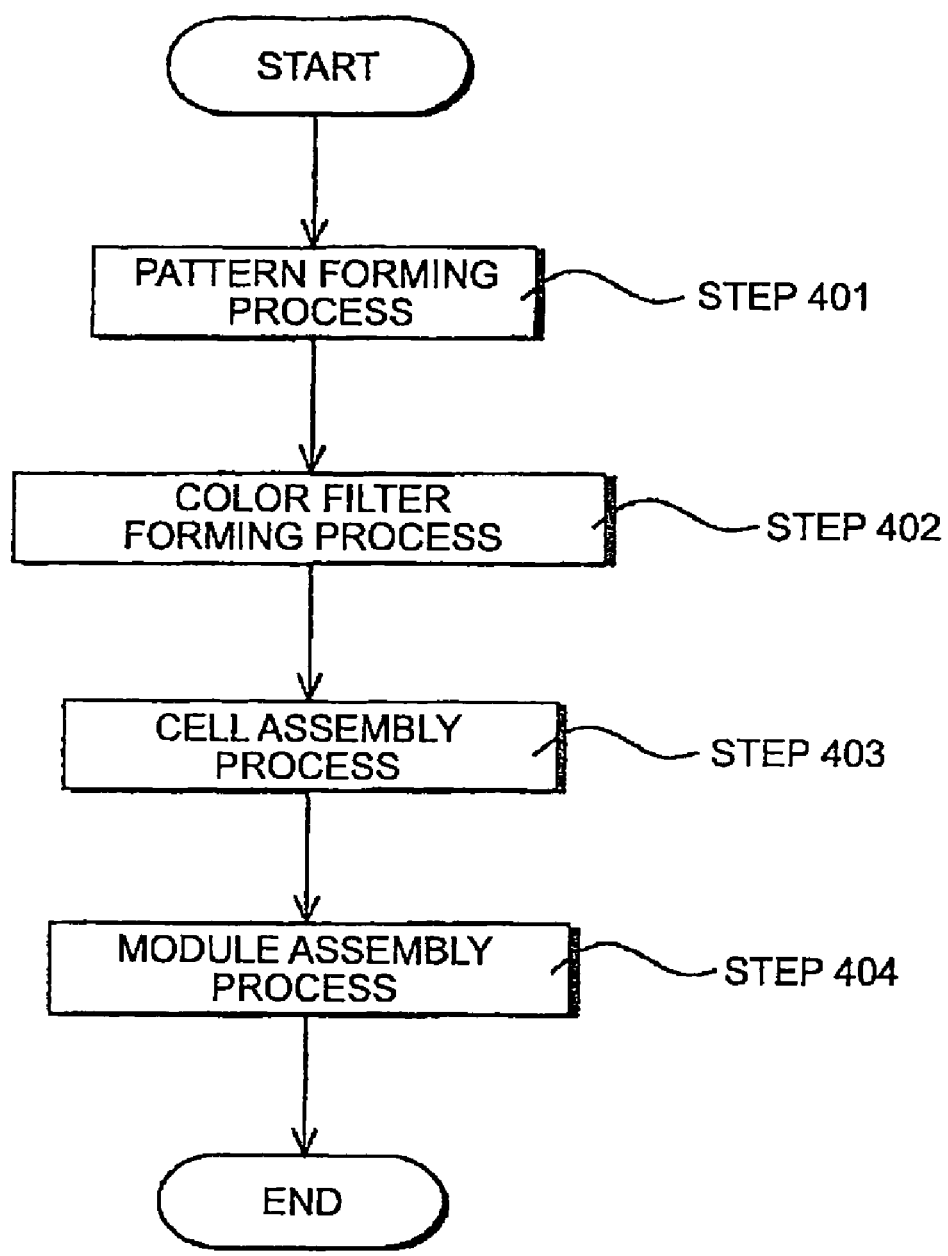
FIG. 9 is a flow chart of the procedure when manufacturing a liquid crystal display device as a micro device.

In addition, a liquid crystal display device as a micro device can be obtained with the exposure apparatus of the above-mentioned embodiment, by forming a predefined pattern (such as a circuit pattern or an electrode pattern) on a plate (glass substrate). An exemplary procedure will be described in the following, referring to the flow chart of FIG. 9. In the pattern forming step 401 of FIG. 9, the so-called light lithography process is performed, in which the mask pattern is transferred by exposure on a photosensitive substrate (such as a glass substrates having resist coated thereon) using the exposure apparatus of the above-mentioned embodiment. A predefined pattern including numerous electrodes is formed on the photosensitive substrate by the light lithography process. Subsequently, a predefined pattern is formed on the exposed substrate, through steps such as the development step, the etching step, the resist removing step and the like, followed by the color filter forming step 402 described below.

Next, the color filter forming step 402 forms a color filter composed of numerous sets of three dots corresponding to R (Red), G (Green), and B (Blue) disposed in a matrix-like arrangement, or a plurality of groups of filters of three stripes corresponding to R, G, and B disposed along the horizontal scan line direction. Then, after the color filter forming step 402, the cell assembly step 403 is performed. In the cell assembly step 403, a liquid crystal panel (liquid crystal cell) is assembled using the substrate having a predefined pattern obtained in the pattern forming step 401, the color filter obtained in the color filter forming step 402.

The cell assembly step 403 manufactures a liquid crystal panels (liquid crystal cell) by injecting liquid crystal between, for example, the substrate having a predefined pattern obtained in the pattern forming step 401 and the color filter obtained in the color filter forming step 402. Subsequently, in the module assembly step 404, the panel is completed as a liquid crystal display device by attaching respective parts such as the electric circuitry for conducting display operation of the assembled liquid crystal panel (liquid crystal cell), back light, and the like. According to the above-mentioned liquid crystal display device manufacturing method, a liquid crystal display device having an extremely fine circuit pattern can be manufactured with a favorable throughput.

Although the above-mentioned embodiment uses KrF excimer laser light (wavelength: 248 nm) or ArF excimer laser light (wavelength: 193 nm) as the expose light, the present invention, without been limited to this, can also be applied to other suitable laser source. In addition, although the present invention is applied to an illumination optical apparatus having a particular arrangement as shown in FIG. 1, in the above-mentioned embodiment, various modifications are possible with regard to specific arrangements of the illumination optical apparatus.

In the evaluation method of the illumination distribution according to the present invention, the Chebyshev polynomials, for example, are set as one-dimensional power polynomials which are orthogonal in a closed interval. The illumination distribution is then approximated by the Chebyshev polynomials to obtain the coefficients of respective terms of the Chebyshev polynomials. As will be described below, the contrast of respective terms in the Chebyshev polynomials is equal to one another, with, for example, the first-order term corresponding to the inclination unevenness component (first-order unevenness component) of the illumination distribution, the second-order term corresponding to the convex/-concave unevenness component (second-order unevenness component) of the illumination distribution, and the fourth-order term corresponding to the fourth-order unevenness component (M-shaped unevenness component or W-shaped unevenness component) of the illumination distribution.

In this manner, the evaluation method of the illumination distribution according to the present invention can express the illumination distribution data by a simple function such as the Chebyshev polynomials, and evaluate illumination unevenness component analytically, based on the information relating to the coefficient of respective terms. As a result, when manufacturing an optical member such as a micro fly's-eye lens, for example, the present invention can control the shape non-uniformity of the micro refracting surfaces so that the illumination distribution with a desired precision is obtained by means of the micro fly's-eye lens, using an evaluation method which expresses the illumination distribution data by a simple function and analytically evaluates the illumination unevenness component.

In addition, the present invention can realize a high-performance illumination optical apparatus which can illuminate the plane to be illuminated with a desired illumination condition, using a micro fly's-eye lens, for example, which can provide the illumination distribution having a desired precision. As a result, the exposure apparatus and the exposure method of the present invention can perform favorable exposure under a favorable illumination condition, whereby enabling manufacture of high-quality micro devices, using a high-performance illumination optical apparatus for illuminating a plane to be illuminated with a desired illumination condition.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An evaluation method performed by a computer for evaluating a one-dimensional illumination distribution using polynomials, the method comprising:
    obtaining the one-dimensional illumination distribution using a photoelectric device;
    setting up, as the polynomials, one-dimensional power polynomials which are orthogonal in a closed interval; and
    approximating the one-dimensional illumination distribution with the power polynomials to obtain the coefficients of respective terms of the power polynomials.

2. The evaluation method according to claim 1, wherein the contrast of respective terms of the power polynomials is approximately equal to one another.

3. The evaluation method according to claim 2, wherein the power polynomials are the Chebyshev polynomials.

4. The evaluation method according to claim 1, further comprising:
    measuring a two-dimensional illumination distribution; and
    converting the two-dimensional illumination distribution obtained in the measuring the two-dimensional illumination distribution into the one-dimensional illumination distribution along a predefined direction.

5. The evaluation method according to claim 4, wherein the measuring the two-dimensional illumination distribution measures the two-dimensional illumination distribution using an imaging device, the method further comprising:
    acquiring the offset for correcting the influence on the actual measurement result of the illumination distribution caused by sensitivity non-uniformity on the imaging plane of the imaging device; and
    correcting the actual measurement result of the illumination distribution based on the offset.

6. The evaluation method according to claim 5, wherein the acquiring the offset comprises:
    obtaining a first measurement data by measuring a first illumination distribution using the imaging device;
    obtaining a first reference data by measuring the first illumination distribution using a measurement means which will not be substantially influenced by sensitivity non-uniformity on the imaging plane;
    obtaining a second measurement data by measuring a second illumination distribution which is different from the first illumination distribution using the imaging device;
    obtaining a second reference data by measuring the second illumination distribution using the measurement means;
    making origins of the first measurement data and the second measurement data in coincidence with the origins of the first reference data and the second reference data so that the difference between the first measurement data and the second measurement data approximately matches the difference between the first reference data and the second reference data; and
    setting up the offset based on at least either one of the difference between the first measurement data and the first reference data, and the difference between the second measurement data and the second reference data, under a condition that the origins of the first measurement data and the second measurement data have been made in coincidence with the origins of the first reference data and the second reference data.

7. The evaluation method according to claim 6, wherein the mean value of the difference between the first measurement data and the first reference data, and the difference between the second measurement data and the second reference data is set as the offset in the setting up the offset.

8. A manufacturing method of an optical member, the method comprising:
    measuring a two-dimensional illumination distribution generated by means of the optical member;
    converting the two-dimensional illumination distribution obtained in the measuring the two-dimensional illumination distribution into a one-dimensional illumination distribution along a predefined direction;
    setting up, as polynomials for use in evaluation of the one-dimensional illumination distribution, one-dimensional power polynomials which are orthogonal in a closed interval;
    approximating the one-dimensional illumination distribution with the power polynomials to obtain the coefficients of respective terms of the power polynomial; and
    manufacturing the optical member, using information relating to the coefficients of respective terms obtained in the approximating the one-dimensional illumination distribution as a control indicator.

9. The manufacturing method according to claim 8, wherein
    the optical member has a plurality of optical elements disposed two-dimensionally, a plurality of optical elements of the optical member superimposingly form the two-dimensional illumination distribution, the measuring the two-dimensional illumination distribution measures a plurality of two-dimensional illumination distributions respectively generated by means of a plurality of partial regions within the effective regions formed by the plurality of optical elements, the converting the two-dimensional illumination distribution converts the plurality of two-dimensional illumination distributions obtained in the measuring the two-dimensional illumination distribution respectively into a plurality of one-dimensional illumination distributions along a predefined direction, the approximating the one-dimensional illumination distribution approximates the plurality of one-dimensional illumination distributions respectively using the power polynomials and obtains a plurality of groups of coefficients of respective terms of the power polynomials, and the manufacturing the optical member uses the information relating to the plurality of groups of coefficients obtained in the approximating the one-dimensional illumination distribution as a control indicator.

10. A manufacturing method of an optical member having a plurality of optical elements disposed two-dimensionally and being composed so that a light beam via respective optical elements superimposingly form a two-dimensional illumination distribution, the method comprising:

measuring a plurality of two-dimensional illumination distributions respectively generated by means of a plurality of partial regions within the effective region formed by the plurality of optical elements;

converting the plurality of two-dimensional illumination distributions obtained in the measuring the plurality of the two dimensional illumination distribution into a plurality of one-dimensional illumination distributions along a predefined direction;

setting up, as polynomials for evaluating the plurality of one-dimensional illumination distributions, one-dimensional power polynomials which are orthogonal in a closed interval;

approximating each of the plurality of one-dimensional illumination distributions by the power polynomials to obtain a plurality of groups of coefficients of respective terms of the power polynomial; and controlling the non-uniformity of the shape of respective optical elements in the optical member, using information relating to the plurality of groups of coefficients obtained in the approximating each of the plurality of one-dimensional illumination distributions as a control indicator.

11. The manufacturing method according to claim 10, wherein the micro fly's-eye lens comprises a first one-dimensional cylindrical lens array disposed along a first direction with a predefined pitch, and a second one-dimensional cylindrical lens array disposed along a second direction intersecting the first direction with a predefined pitch.

12. The manufacturing method according to claim 8, wherein the contrast of respective terms of the power polynomial is approximately equal to one another.

13. The manufacturing method according to claim 8, wherein the power polynomial is the Chebyshev polynomial.

14. The manufacturing method according to claim 8, further comprising:

acquiring the offset for correcting the influence on the actual measurement result of the illumination distribution caused by sensitivity non-uniformity on the imaging plane of the imaging device; and correcting the actual measurement result of the illumination distribution based on the offset.

15. The manufacturing method according to claim 14, wherein the acquiring the offset comprises:

obtaining a first measurement data by measuring a first illumination distribution using the imaging device;

obtaining a first reference data by measuring the first illumination distribution using a measurement means which will not be substantially influenced by sensitivity non-uniformity on the imaging plane;

obtaining a second measurement data by measuring a second illumination distribution which is different from the first illumination distribution using the imaging device;

obtaining a second reference data by measuring the second illumination distribution using the measurement means;

making origins of the first measurement data and the second measurement data in coincidence with the origins of the first reference data and the second reference data so that the difference between the first measurement data and the second measurement data approximately matches the difference between the first reference data and the second reference data; and setting up the offset based on at least either one of the difference between the first measurement data and the first reference data, and the difference between the second measurement data and the second reference data, under a condition that the origins of the first measurement data and the second measurement data have been made in coincidence with the origins of the first reference data and the second reference data.

16. The manufacturing method according to claim 15, wherein the mean value of difference between the first measurement data and the first reference data and the difference between the second measurement data and the second reference data is set as the offset, in the setting up the offset.

17. The manufacturing method according to claim 8, wherein the root sum square of the standard deviation of the plurality of groups of coefficients are used as the controlling the non-uniformity of the shape of respective optical elements.

18. An optical member manufactured by the manufacturing method according to claim 17, wherein RSS $\leq 1\%$ is satisfied, where RSS denotes the root sum square of the standard deviation of the plurality of groups of coefficients.

19. An illumination optical apparatus for illuminating a plane to be illuminated, wherein the illumination distribution is generated on the plane to be illuminated or on a location optically approximately conjugate with the plane to be illuminated, by means of the optical member manufactured by the manufacturing method according to claim 8.

20. An exposure apparatus having the illumination optical apparatus according to claim 19, wherein a mask pattern disposed on the plane to be illuminated is exposed onto a photosensitive substrate.

21. The exposure apparatus according to claim 20, further comprising:

projection optics for forming the mask pattern image on the photosensitive substrate, wherein the exposure apparatus is arranged so as to transfer the mask pattern onto the photosensitive substrate while displacing the mask and the photosensitive substrate relatively to the projection optics along the scanning direction, and the two-dimensional illumination distribution is converted into the one-dimensional illumination distribution along a direction which is orthogonal to the scanning direction, in the converting the two-dimensional illumination distribution.

22. An exposure method, wherein the mask disposed on the plane to be illuminated is illuminated using the illumination optical apparatus according to claim 19, and the mask pattern is exposed onto a photosensitive substrate.

23. The exposure method according to claim 22, further comprising:

transferring the mask pattern onto the photosensitive substrate while displacing the mask and the photosensitive substrate relatively to the projection optics which forms the mask pattern image onto the photosensitive substrate along a scanning direction, wherein the two-dimensional illumination distribution is converted into the one-dimensional illumination distribution along a direction which is orthogonal to the scanning direction, in the converting the two-dimensional illumination distribution.

24. A manufacturing method of an optical member having a plurality of optical elements disposed two-dimensionally and being composed so that a light beam via respective optical elements superimposingly form a two-dimensional illumination distribution, the method comprising:

measuring a plurality of two-dimensional illumination distributions respectively generated by means of a plurality of partial regions within the effective region formed by the plurality of optical elements;

converting the plurality of two-dimensional illumination distributions obtained in the measuring the plurality of two-dimensional illumination distributions into a plurality of one-dimensional illumination distributions along a predefined direction;

setting up, as polynomials for evaluating the plurality of one-dimensional illumination distributions, one-dimensional power polynomials which are orthogonal in a closed interval;

approximating each of the plurality of one-dimensional illumination distributions by the power polynomials to obtain a plurality of groups of coefficients of respective terms of the power polynomial; and controlling the non-uniformity of the shape of respective optical elements in the optical member, using information relating to the plurality of groups of coefficients obtained in the approximating each of the plurality of one-dimensional illumination distributions as a control indicator.

25. The manufacturing method according to claim 24, wherein the optical member is a micro fly's-eye lens.

26. The manufacturing method according to claim 25, wherein the micro fly's-eye lens comprises a first one-dimensional cylindrical lens array disposed along a first direction with a predefined pitch, and a second one-dimensional cylindrical lens array disposed along a second direction intersecting the first direction with a predefined pitch.

27. The manufacturing method according to claim 24, wherein the contrast of respective terms of the power polynomial is approximately equal to one another.

28. The manufacturing method according to claim 24, wherein the power polynomial is the Chebyshev polynomial.

29. The manufacturing method according to claim 28, further comprising:

acquiring the offset for correcting the influence on the actual measurement result of the illumination distribution caused by sensitivity non-uniformity on the imaging plane of the imaging device; and correcting the actual measurement result of the illumination distribution based on the offset.

30. The manufacturing method according to claim 29, wherein the acquiring the offset comprises:

obtaining a first measurement data by measuring a first illumination distribution using the imaging device;

obtaining a first reference data by measuring the first illumination distribution using a measurement means which will not be substantially influenced by sensitivity non-uniformity on the imaging plane;

obtaining a second measurement data by measuring a second illumination distribution which is different from the first illumination distribution using the imaging device;

obtaining a second reference data by measuring the second illumination distribution using the measurement means;

making origins of the first measurement data and the second measurement data in coincidence with the origins of the first reference data and the second reference data so that the difference between the first measurement data and the second measurement data approximately matches the difference between the first reference data and the second reference data; and setting up the offset based on at least either one of the difference between the first measurement data and the first reference data, and the difference between the second measurement data and the second reference data, under a condition that the origins of the first measurement data and the second measurement data have been made in coincidence with the origins of the first reference data and the second reference data.

31. The manufacturing method according to claim 30, wherein the mean value of difference between the first measurement data and the first reference data and the difference between the second measurement data and the second reference data is set as the offset, in the setting up the offset.

32. The manufacturing method according to claim 24, wherein the root sum square of the standard deviation of the plurality of groups of coefficients are used as the control indicator, in the controlling the non-uniformity of the shape of the respective optical elements.

33. An optical member manufactured by the manufacturing method according to claim 32, wherein RSS $\leq 1\%$ is satisfied, where RSS denotes the root sum square of the standard deviation of the plurality of groups of coefficients.

34. An illumination optical apparatus for illuminating a plane to be illuminated, wherein the illumination distribution is generated on the plane to be illuminated or on a location optically approximately conjugate with the plane to be illuminated, by means of the optical member manufactured by the manufacturing method according to claim 24.

35. An exposure apparatus having the illumination optical apparatus according to claim 34, wherein a mask pattern disposed on the plane to be illuminated is exposed onto a photosensitive substrate.

36. The exposure apparatus according to claim 35, further comprising:

projection optics for forming the mask pattern image on the photosensitive substrate, wherein the exposure apparatus is arranged so as to transfer the mask pattern onto the photosensitive substrate while displacing the mask and the photosensitive substrate relatively to the projection optics along the scanning direction, and the two-dimensional illumination distribution is converted into the one-dimensional illumination distribution along a direction which is orthogonal to the scanning direction, in the converting the plurality of two dimensional illumination distributions.

37. An exposure method, wherein the mask disposed on the plane to be illuminated is illuminated using the illumination optical apparatus according to claim 34, and the mask pattern is exposed onto a photosensitive substrate.

38. The exposure method according to claim 37, further comprising:

transferring the mask pattern onto the photosensitive substrate while displacing the mask and the photosensitive substrate relatively to the projection optics which forms the mask pattern image onto the photosensitive substrate along a scanning direction, wherein the two-dimensional illumination distribution is converted into the one-dimensional illumination distribution along a direction which is orthogonal to the scanning direction, in the converting the plurality of two dimensional illumination distributions.

39. An illumination measurement apparatus, comprising:

a photodetector for measuring the illumination distribution and a processing unit for evaluating the illumination distribution based on a signal from the photodetector by using polynomials, and outputting the result, wherein the processing unit approximates the one-dimensional illumination distribution corresponding to the illumination distribution, by one-dimensional power polynomials which are orthogonal in a closed interval to obtain the coefficients of respective terms of the power polynomials.

40. The illumination measurement apparatus according to claim 39, wherein the contrast of respective terms of the power polynomials is approximately equal to one another.

41. The illumination measurement apparatus according to claim 40, wherein the power polynomials are the Chebyshev polynomials.

42. The illumination measurement apparatus according to claim 41, wherein the processing unit acquires an offset for correcting the influence on the actual measurement result of the illumination distribution caused by the sensitivity non-uniformity on the imaging plane of the imaging device, and corrects the actual measurement result of the illumination distribution, based on the offset.

43. The illumination measurement apparatus according to claim 42, wherein the processing unit obtains a first measurement data by measuring a first illumination distribution using the imaging device; obtains a first reference data by measuring the first illumination distribution using a measurement means which will not be substantially influenced by sensitivity non-uniformity on the imaging plane; obtains a second measurement data by measuring a second illumination distribution which is different from the first illumination distribution using the imaging device; obtains a second reference data by measuring the second illumination distribution using the measurement means; makes the origins of the first measurement data and the second measurement data in coincidence with the origins of the first reference data and the second reference data so that the difference between the first measurement data and the second measurement data approximately matches the difference between the first reference data and the second reference data; and sets up the offset based on at least either one of the difference between the first measurement data and the first reference data and the difference between the second measurement data and the second reference data, under a condition that the origins of the first measurement data and the second measurement data have been made in coincidence with the origins of the first reference data and the second reference data.

44. The illumination measurement apparatus according to claim 43, wherein the mean value of the difference between the first measurement data and the first reference data and the difference between the second measurement data and the second reference data is set as the offset in the processing unit.

45. An exposure apparatus for exposing the mask pattern onto a photosensitive substrate, the exposure apparatus comprising:

the illumination measurement apparatus according to claim 39 for evaluating, by polynomials, and outputting the illumination distribution on the photosensitive substrate or on a surface which is optically approximately conjugate with the photosensitive substrate; and an adjustment means for adjusting the illumination distribution based on the output of the illumination measurement apparatus.

46. The exposure apparatus according to claim 45, further comprising:

projection optics for forming the mask pattern image on the photosensitive substrate, wherein the exposure apparatus is arranged so as to transfer the mask pattern onto the photosensitive substrate while displacing the mask and the photosensitive substrate relatively to the projection optics along the scanning direction, and the illumination measurement apparatus converts the illumination distribution into the one-dimensional illumination distribution along a direction which is orthogonal to the scanning direction.

47. An exposure method for exposing the mask pattern onto a photosensitive substrate, the method comprising:

evaluating, by polynomials, the illumination distribution on the photosensitive substrate or on a surface which is optically approximately conjugate with the photosensitive substrate, using the illumination measurement apparatus according to claim 39; and adjusting the illumination distribution based on the evaluation of the evaluating, by polynomials, the illumination distribution.

48. The exposure method according to claim 47, further comprising:

transferring the mask pattern onto the photosensitive substrate while displacing the mask and the photosensitive substrate relatively to the projection optics along the scanning direction, thereby forming the mask pattern image onto the photosensitive substrate, wherein the illumination distribution is converted into the one-dimensional illumination distribution along a direction which is orthogonal to the scanning direction, in the evaluating, by polynomials, the illumination distribution.

49. An optical member manufactured using the manufacturing method of claim 8.

50. An optical member manufactured using the manufacturing method of claim 24.

51. The manufacturing method according to claim 9, wherein the optical member is a micro fly's-eye lens.

* * * * *

UNITED STATES PATENT AND TRADEMARK OFFICE
CERTIFICATE OF CORRECTION

PATENT NO. : 7,618,767 B2 Page 1 of 1
APPLICATION NO. : 11/352263
DATED : November 17, 2009
INVENTOR(S) : Toyoda et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 843 days.

Signed and Sealed this

Twenty-sixth Day of October, 2010

David J. Kappos
*Director of the United States Patent and Trademark Office*